US009871536B1

(12) United States Patent  
Ideuchi et al.

(10) Patent No.: US 9,871,536 B1  
(45) Date of Patent: Jan. 16, 2018

(54) ENCODING APPARATUS, ENCODING METHOD AND SEARCH METHOD

(71) Applicant: FUJITSU LIMITED, Kawasaki-shi, Kanagawa (JP)

(72) Inventors: Masao Ideuchi, Hachioji (JP); Masahiro Kataoka, Kamakura (JP); Seiji Okura, Meguro (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/655,005

(22) Filed: Jul. 20, 2017

(30) Foreign Application Priority Data

Jul. 27, 2016 (JP) .................................. 2016-147848

(51) Int. Cl.
*H03M 7/40* (2006.01)
*G06F 17/22* (2006.01)
*G06F 17/27* (2006.01)

(52) U.S. Cl.
CPC ............ *H03M 7/40* (2013.01); *G06F 17/227* (2013.01); *G06F 17/271* (2013.01); *G06F 17/277* (2013.01); *G06F 17/2755* (2013.01); *G06F 17/2775* (2013.01); *G06F 17/2785* (2013.01)

(58) Field of Classification Search
CPC ...... H03M 7/40; G06F 17/227; G06F 17/271; G06F 17/277; G06F 17/2775; G06F 17/2785; G06F 17/2755
USPC .......................... 341/50–75; 704/2, 4, 7, 8, 9
See application file for complete search history.

(56) References Cited

U.S. PATENT DOCUMENTS

| 5,687,384 | A | * | 11/1997 | Nagase | G06F 17/271 704/2 |
| 5,950,194 | A | * | 9/1999 | Bennett | G06F 17/24 348/E7.083 |
| 6,826,724 | B1 | * | 11/2004 | Shimada | G06F 17/2229 707/999.004 |
| 8,417,512 | B2 | * | 4/2013 | Larvet | G06F 17/274 704/1 |
| 8,606,559 | B2 | * | 12/2013 | Jin | G06F 17/2755 704/2 |
| 8,788,524 | B1 | * | 7/2014 | Wolfram | G06F 17/3064 707/737 |
| 9,715,524 | B1 | * | 7/2017 | Zhang | G06F 17/30401 |
| 2006/0106837 | A1 | * | 5/2006 | Choi | G06F 17/2247 |
| 2007/0010990 | A1 | * | 1/2007 | Woo | G06F 17/271 704/4 |
| 2016/0210508 | A1 | * | 7/2016 | Ideuchi | G06F 17/22 |

FOREIGN PATENT DOCUMENTS

| JP | 4-156663 | 5/1992 |
| JP | 2003-44459 | 2/2003 |
| JP | 2016-134100 | 7/2016 |

* cited by examiner

*Primary Examiner* — Lam T Mai
(74) *Attorney, Agent, or Firm* — Oblon, McClelland, Maier & Neustadt, L.L.P.

(57) ABSTRACT

A computer generates a plurality of pieces of syntax information respectively corresponding to a plurality of words in a compression target document by analyzing relationships between the plurality of words. Next, the computer assigns a plurality of compression codes to the plurality of words and to the plurality of pieces of syntax information. Then, the computer outputs the plurality of compression codes with an arrangement of a specific order.

18 Claims, 31 Drawing Sheets

- eld
- par
-   An
- us(
- August 2
- 3,
- ).
- An
- pla
- nation
- of the
- lat
-   Algorithm
- ".
- comp

FIG. 4

- compression.
- .z
- zli
- ib
- b.
- .n
- net
- t.
-  htt
- tp://
- /www
- w.
- .z
- zlib
- b.n

F I G. 5

| WORD ID | WORD | ADDITIONAL INFORMATION |
|---|---|---|
| 1 | SAKURA (CHERRY BLOSSOMS) | NOUN |
| 2 | GAKKOU (SCHOOL) | NOUN |
| 3 | NO | POSTPOSITIONAL PARTICLE |
| ⋮ | | |

FIG. 10

| ID | COMPRESSION CODE |
|---|---|
| 1 | C01234h |
| 2 | C02123h |
| 3 | C00101h |
| ⋮ | |

FIG. 16

| S | NP | VP | PP | N | V | P | D | A | BINARY TREE OF CHILD |
|---|---|---|---|---|---|---|---|---|---|
| 0x00 | 0x01 | 0x02 | 0x03 | 0x04 | 0x05 | 0x06 | 0x07 | 0x08 | 0x20~ |

F I G. 17

| ID | INTERMEDIATE CODE |
|---|---|
| 1 | C01234h |
| 2 | C02123h |
| 3 | C00101h |
| ⋮ | |

FIG. 25

| DOCUMENT ID | CONTENTS |
|---|---|
| 1 | SAKURA (CHERRY BLOSSOMS)<br>GAKKOU (SCHOOL)<br>NO··· |
| 2 | KAEDE (MAPLE)<br>GAKKOU (SCHOOL)<br>NO··· |
| ⋮ | |

| DOCUMENT ID | SAKURA (CHERRY BLOSSOMS) | KAEDE (MAPLE) | GAKKOU (SCHOOL) | NO | ⋮ | | |
|---|---|---|---|---|---|---|---|
| 1 | 1 | 0 | 1 | 1 | | | |
| 2 | 0 | 1 | 1 | 1 | | | |
| ⋯ | ⋯ | ⋯ | ⋯ | ⋯ | | | |

| ID | COMPRESSION CODE |
|---|---|
| 1 | 010···011 |
| 2 | 010···111 |
| 3 | 011···01 |
| ⋮ | |

F I G. 2 8

ENCODING APPARATUS, ENCODING METHOD AND SEARCH METHOD

CROSS-REFERENCE TO RELATED APPLICATION

This application is based upon and claims the benefit of priority of the prior Japanese Patent Application No. 2016-147848, filed on Jul. 27, 2016, the entire contents of which are incorporated herein by reference.

FIELD

The embodiments discussed herein relate to an encoding apparatus, an encoding method and a search method.

BACKGROUND

FIG. 1 illustrates an example of a relationship among various text analyses for documents. In the text analyses, a lexical analysis, a morphological analysis (part-of-speech analysis), a syntax analysis (dependency analysis), a semantic analysis, and the like are included. The lexical analysis is processing for dividing sentences within documents into words based on literation. Further, the morphological analysis is processing for dividing sentences into morphemes and for giving part-of-speech information to each morpheme. The morpheme obtained by the morphological analysis may be handled as a word.

The syntax analysis is processing for synthesizing a clause including a self-sufficient word based on part-of-speech information of words and for finding a dependency relationship (modification relationship) between two clauses based on the self-sufficient word included in the clause. The semantic analysis is processing for finding meanings of a synonymous expression or a multivocal expression based on the dependency relationship, or processing for extracting a synonym from among a plurality of words. A synonym extraction, which is a practical-type semantic analysis, can be performed based on only words, or words and part-of-speech information. Further, accuracy is improved in the semantic analysis by using the dependency relationship.

In the syntax analysis, for example, a structure is defined in a rule base, and an analysis is performed while a plurality of structures are combined, if desired. A rule used in the syntax analysis is, for example, as follows.

S→NP VP (S: sentence, NP: noun phrase, VP: verb phrase)

VP→V S (VP: verb phrase, V: verb, S: clause)

The above-described rule is applied repeatedly, and thereby a tree structure corresponding to a sentence as illustrated in FIG. 2 is generated eventually. "A" represents an adjective, "N" represents a noun, and "Adv" represents an adverb. The dependency relationship is determined from the generated tree structure. Examples of a method for determining the dependency relationship include a method for determining it from the tree structure of the whole sentence, a method for determining it from a partial tree structure by focusing attention on a clause etc., and the like.

FIG. 3 illustrates an example of application processing for applying an analysis result of a conventional text analysis. A document 311 is compressed using a compression dictionary 301, and is stored as a compressed document 312. When the application processing is performed, the compressed document 312 is decompressed and the document 311 is restored. Further, the lexical analysis and the syntax analysis are performed with respect to the document 311 using an analysis dictionary 302, and thereby an analysis result 313 is generated. Next, word information and the like are tabulated using the document 311 and the analysis result 313, and thereby a tabulation result 314 is generated. Further, the analysis result 313 and the tabulation result 314 are utilized by an application program and the like.

A data compression method is also known, by which a data amount can be reduced and data can be exchanged after simultaneously applying enciphering by using structure information of structured data (see, for example, Patent Document 1). In accordance with this data compression method, in a compression module, internal expression data of the structured data is separated to the structure information and content using previously applied syntax designation information, and further the structure information and the content are compressed together. The compressed data is delivered from a transmitting side system to a receiving side system through a network. In a decompression module, the received compressed data is restored to the internal expression data of the structured data using the syntax designation information.

Patent Document 1: Japanese Laid-open Patent Publication No. 2003-44459

SUMMARY

According to an aspect of the embodiments, a non-transitory computer-readable recording medium stores therein an encoding program that causes a computer to execute the following process.

(1) The computer generates a plurality of pieces of syntax information respectively corresponding to a plurality of words in a compression target document by analyzing relationships between the plurality of words.

(2) The computer assigns a plurality of compression codes to the plurality of words and to the plurality of pieces of syntax information.

(3) The computer outputs the plurality of compression codes with an arrangement of a specific order.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram illustrating a compression dictionary of LZ77 coding;

FIG. 5 is a diagram illustrating a compression dictionary of LZ78 coding;

FIG. 10 is a diagram illustrating a word dictionary;

FIG. 16 is a diagram illustrating a code table of compression codes in the first concrete example;

FIG. 17 is a diagram illustrating the least significant 8 bits of a syntax code and a nesting code;

FIG. 25 is a diagram illustrating a code table of intermediate codes in the second concrete example;

FIG. 26 is a diagram illustrating a plurality of compression target documents;

FIG. 27 is a diagram illustrating tabulation information;

FIG. 28 is a diagram illustrating a code table of compression codes in the second concrete example;

DESCRIPTION OF EMBODIMENTS

Hereinafter, preferred embodiments of the present invention will be described in detail with reference to the accompanying drawings.

Figure 1:
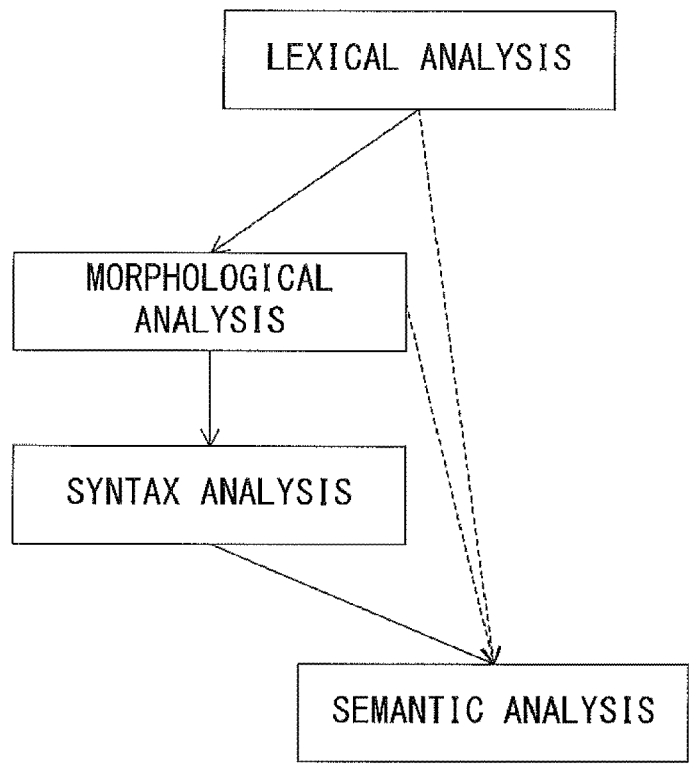
FIG. 1 is a diagram illustrating a relationship between text analyses.
Figure 2:
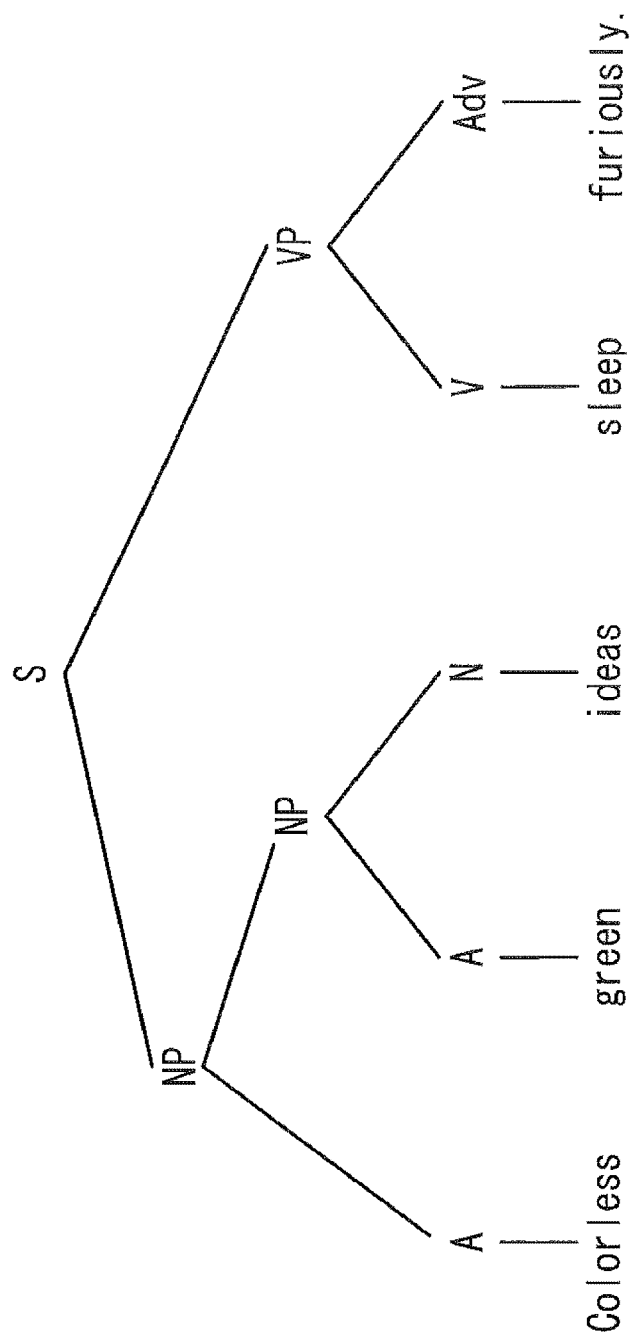
FIG. 2 is a diagram illustrating a tree structure of a sentence.
Figure 3:
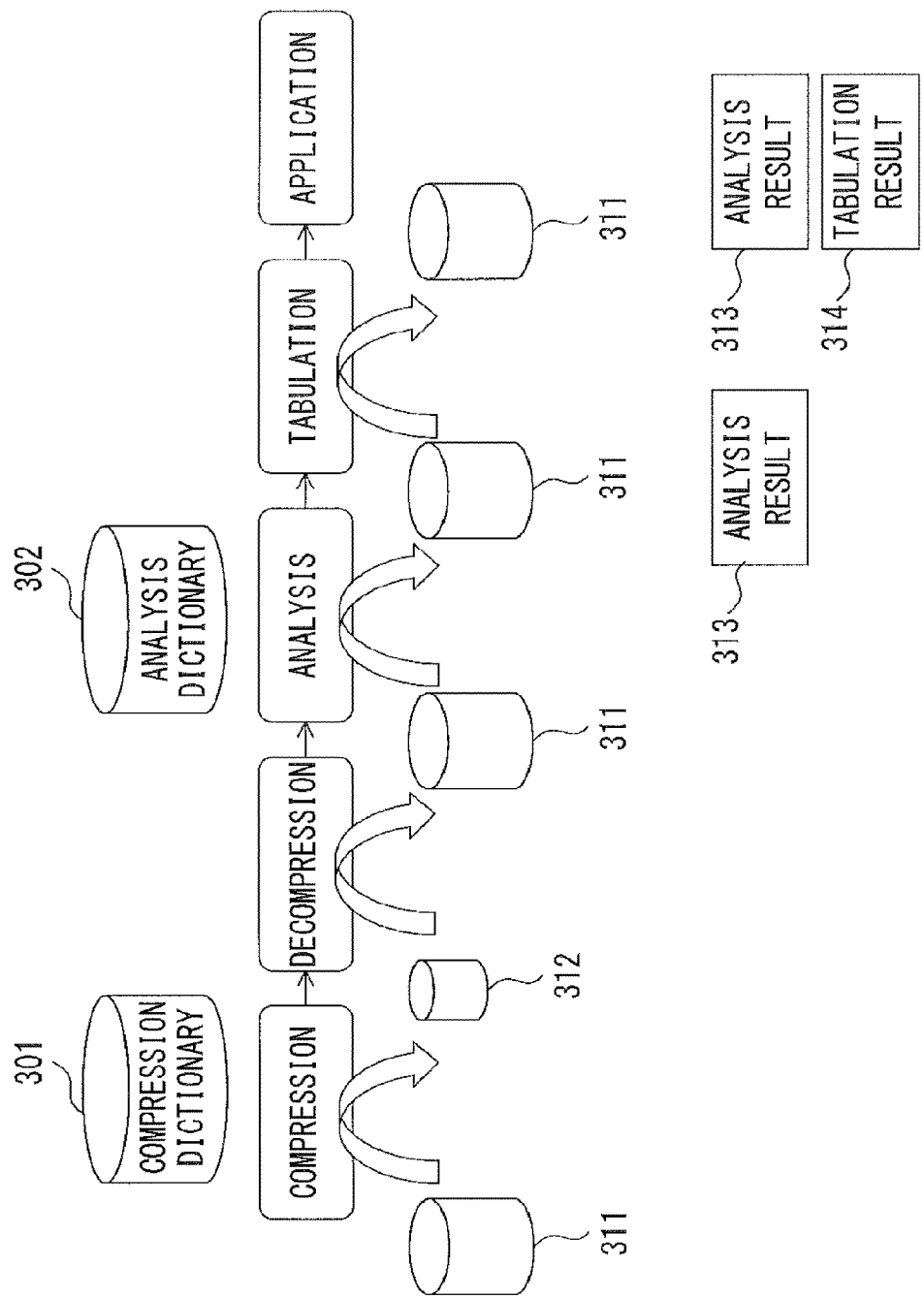
FIG. 3 is a diagram illustrating conventional application processing.

In application processing illustrated in FIG. 3, a compressed document is decompressed, and then a lexical analysis, a syntax analysis, and tabulation are performed, and therefore a processing load becomes large. In the syntax analysis, for example, a calculation amount for searching for an applicable rule becomes an order of $N^2$ or $N^3$ with respect to the number N of words included in a sentence, and therefore a load of the syntax analysis is large. In particular, in an information processing apparatus in which computational resources are small as in a mobile terminal, a large effect of the application processing load is exerted on the information processing apparatus.

Consequently, to reduce the load of the application processing, it is also conceivable that the lexical analysis and the syntax analysis are performed before compressing a document, and a syntax analysis result is compressed and stored along with the document. However, the amount of data of the syntax analysis result is several times or several tens of times as much as the amount of data of analysis target document, and therefore a lot of storage areas are occupied.

Further, when the application processing is performed, the syntax analysis need not be performed. However, processing for decompressing the compressed syntax analysis result is added. In this case, the compressed document and the compressed syntax analysis result are decompressed and the decompressed document is associated with the decompressed syntax analysis result. Subsequently, the syntax analysis result can be utilized. Accordingly, a load of the decompression processing and that of the associating processing are not reduced.

The reason why the compressed document and the compressed syntax analysis result are decompressed is that there is no commonality between a compression dictionary and an analysis dictionary. In the compression dictionary, as in the longest-match character string, a character string for encoding in which words are not conscious is stored. On the other hand, in the analysis dictionary, information on words and parts of speech is stored.

FIG. 4 illustrates an example of the compression dictionary used for LZ77 coding, and FIG. 5 illustrates an example of the compression dictionary used for LZ78 coding. As illustrated in FIGS. 4 and 5, character strings of the compression dictionary are divided in the middle of a word in many cases, and information on the words is not maintained. Therefore, it is difficult to match the character strings of the compression dictionary with the syntax analysis result.

The above-described problem occurs not only in the case in which the word information etc. are tabulated using the syntax analysis result but also in the case in which the syntax analysis result is used in other processing.

In order to perform other processing without decompressing the compressed document and the compressed syntax analysis result, it is conceivable to share a dictionary for the compression processing and the lexical analysis by using words of a natural language as a character string of the compression dictionary. By performing lexical analysis and compressing words based on a single dictionary, each word can be associated with the syntax analysis result of the word in the state where they are still compressed.

Figure 6:
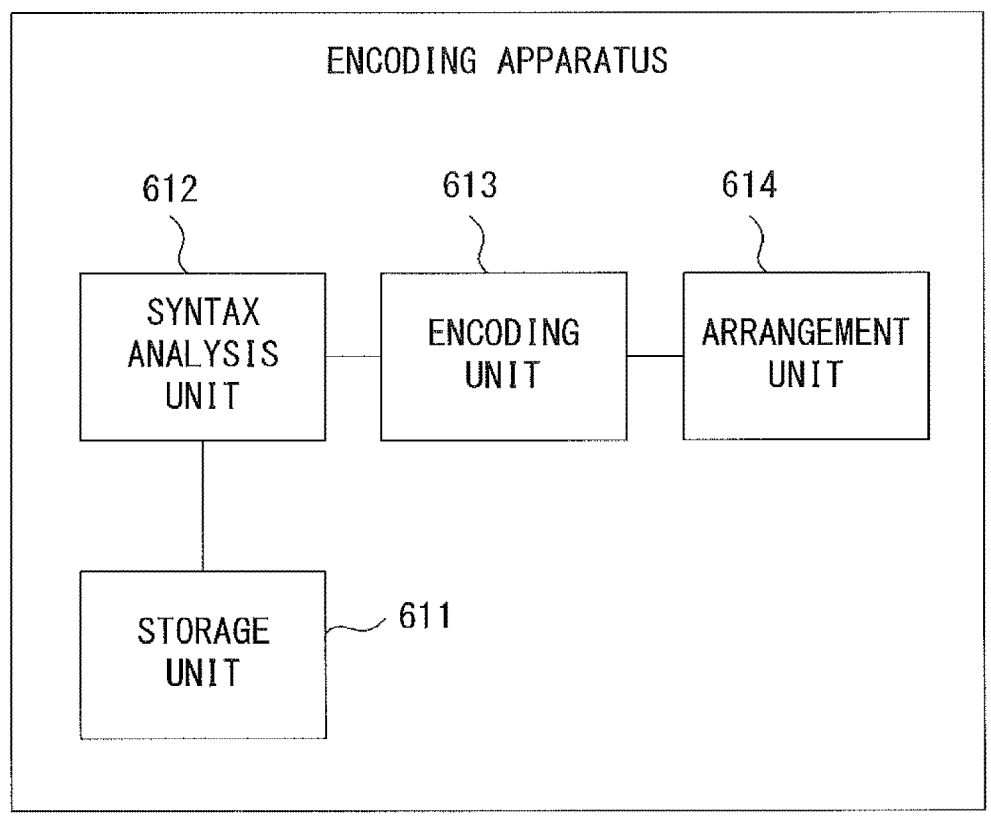
FIG. 6 is a functional block diagram of an encoding apparatus.

FIG. 6 illustrates a functional block example of an encoding apparatus according to the embodiment. The encoding apparatus 601 of FIG. 6 includes a storage unit 611, a syntax analysis unit 612, an encoding unit 613, and an arrangement unit 614.

The storage unit 611 stores a compression target document. The syntax analysis unit 612 performs the syntax analysis for the compression target document, and the encoding unit 613 performs the compression processing for the compression target document and the syntax analysis result. The arrangement unit 614 arranges and outputs the compressed result.

Figure 7:
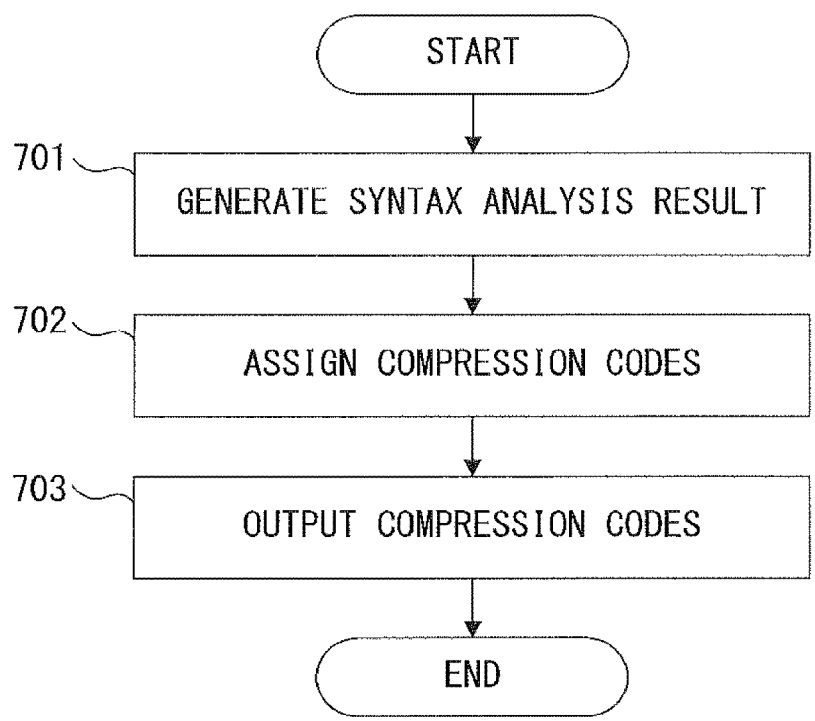
FIG. 7 is a flowchart of encoding processing.

FIG. 7 is a flowchart illustrating an example of encoding processing performed by the encoding apparatus 601 of FIG. 6. First, the syntax analysis unit 612 generates a plurality of pieces of syntax information respectively corresponding to a plurality of words in a compression target document by analyzing relationships between the plurality of words (step 701). Next, the encoding unit 613 assigns a plurality of compression codes to the plurality of words and to the plurality of pieces of syntax information (step 702). Further, the arrangement unit 614 outputs the plurality of compression codes with an arrangement of a specific order (step 703).

The above-described encoding apparatus 601 permits the processing load for applying the syntax analysis result of the document to be reduced.

Figure 8:
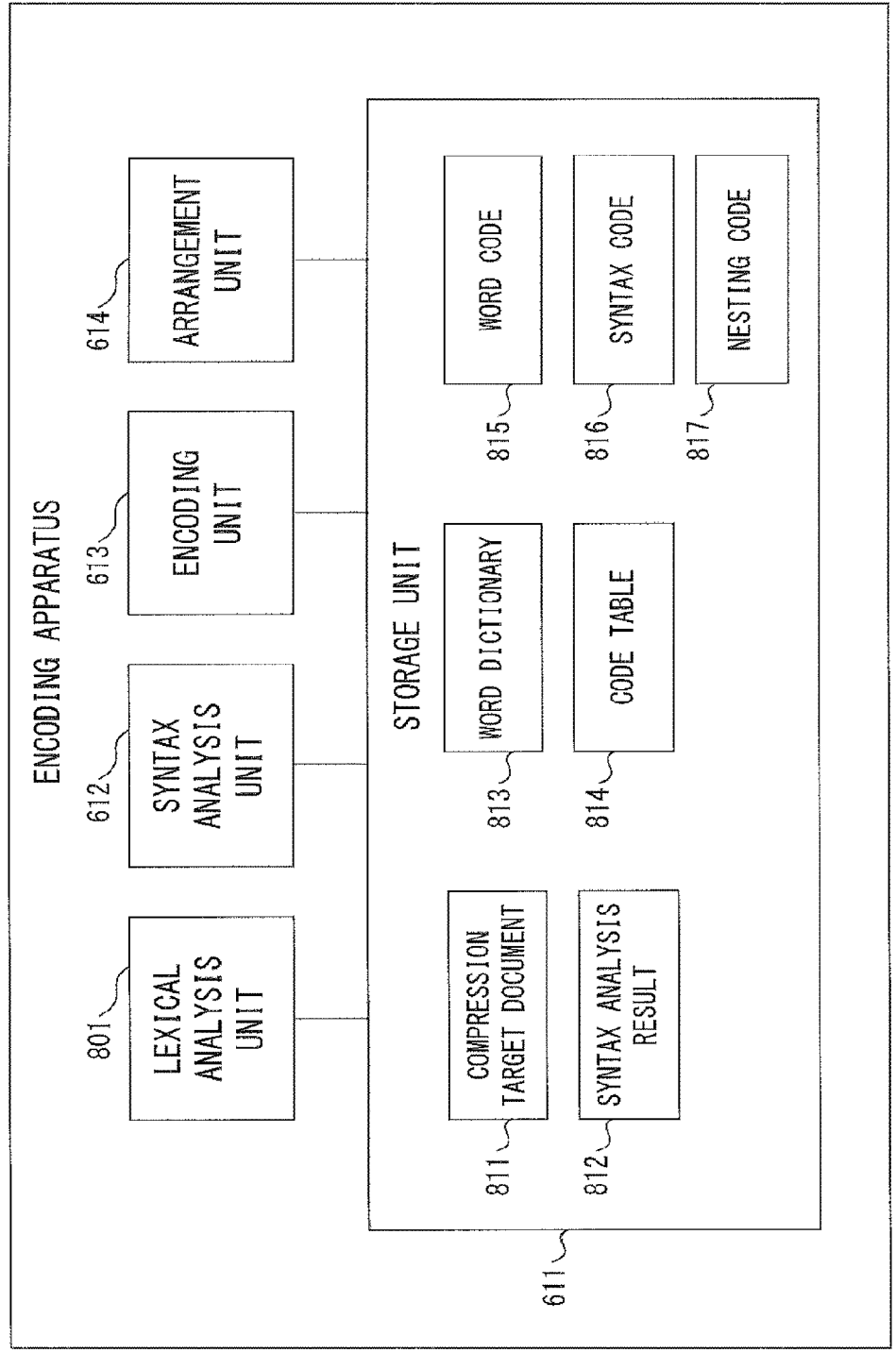
FIG. 8 is a functional block diagram illustrating a first concrete example of the encoding apparatus.

FIG. 8 illustrates a first concrete example of the encoding apparatus 601 of FIG. 6. The encoding apparatus 601 of FIG. 8 includes the storage unit 611, the syntax analysis unit 612, the encoding unit 613, the arrangement unit 614, and a lexical analysis unit 801. When the encoding processing is started, the storage unit 611 stores a compression target document 811, a word dictionary 813, and a code table 814.

Figure 9:
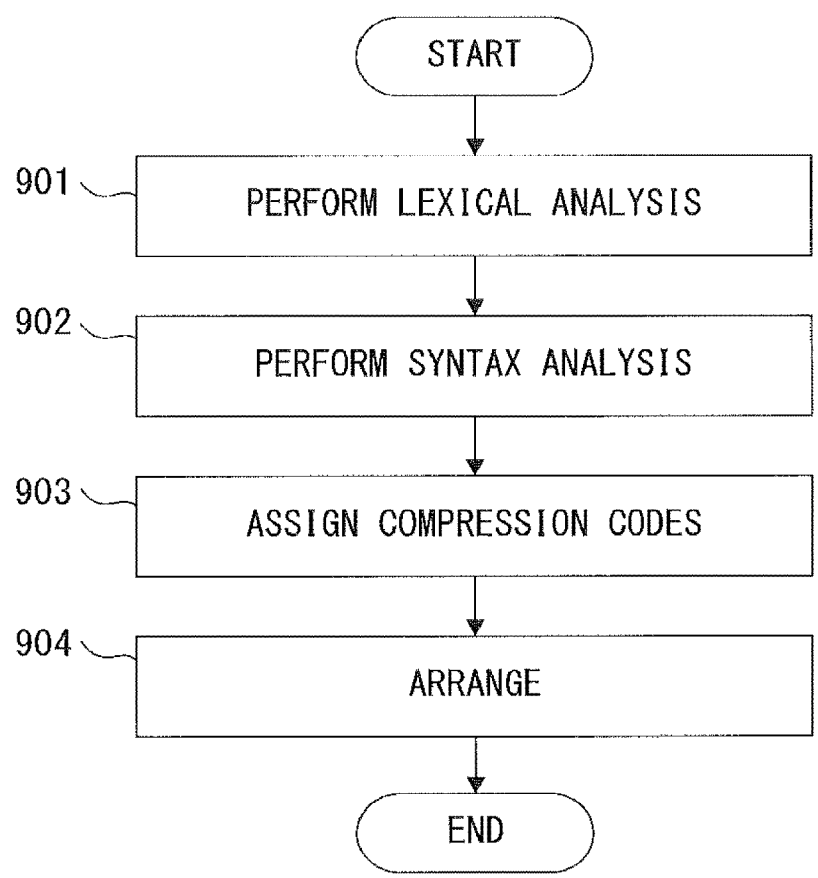
FIG. 9 is a flowchart illustrating the first concrete example of the encoding processing.

FIG. 9 is a flowchart illustrating the first concrete example of the encoding processing of FIG. 7. The encoding processing of FIG. 9 is performed using the encoding apparatus 601 of FIG. 8. Using the word dictionary 813, the lexical analysis unit 801 performs lexical analysis for the compression target document 811, and extracts words included in each sentence within the compression target document 811 (step 901).

FIG. 10 illustrates an example of the word dictionary 813. Each entry of the word dictionary 813 of FIG. 10 includes a word ID for identifying a word, the word, and additional information. The additional information is information indicating an attribute of the word, for example, information on the part of speech. The lexical analysis unit 801 compares a character string of each sentence with that of each word registered in the word dictionary 813 to thereby extract a corresponding word.

Next, the syntax analysis unit 612 performs the syntax analysis for each sentence using analysis result of the lexical analysis, generates the syntax analysis result 812, and stores it in the storage unit 611 (step 902).

Figure 11:
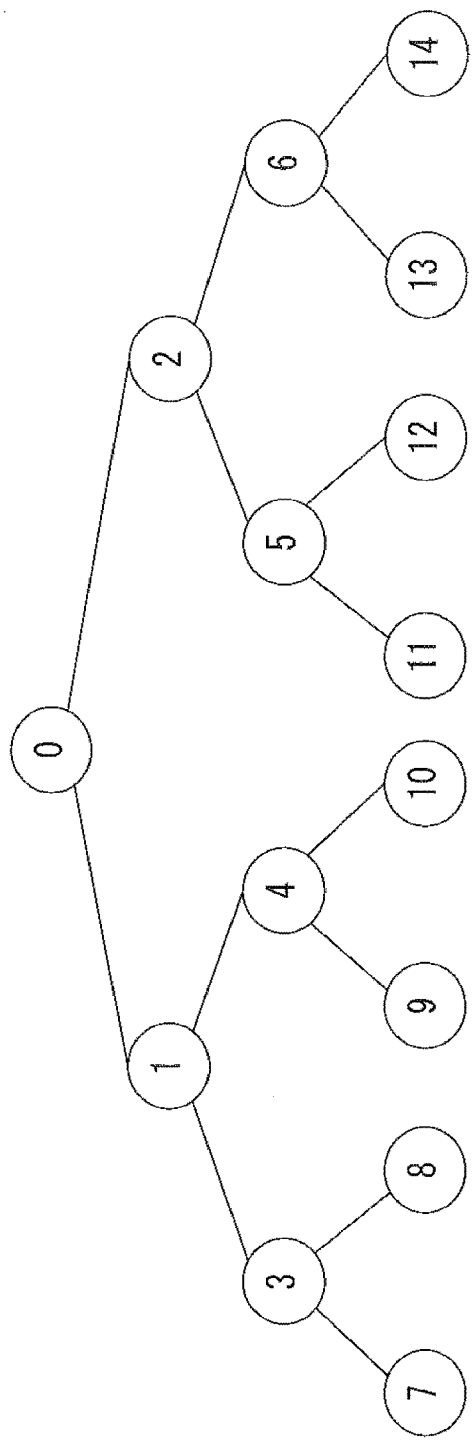
FIG. 11 is a diagram illustrating a syntax tree of a fundamental form.

FIG. 11 illustrates an example of a syntax tree indicating the syntax analysis result 812. The syntax tree of FIG. 11 is a binary tree of four hierarchies including 15 nodes from a node 0 to a node 14, and the number of each node indicates a position in a tree structure of the binary tree. A plurality of subtrees using this binary tree as a fundamental form are connected to each other using nested structures to thereby generate a syntax tree having a deeper hierarchical structure. The syntax tree is characterized by deepening only one portion, and further another subtree is grafted onto a leaf node of the subtree of the fundamental form to thereby reduce a proportion of unnecessary portions.

Figure 12:
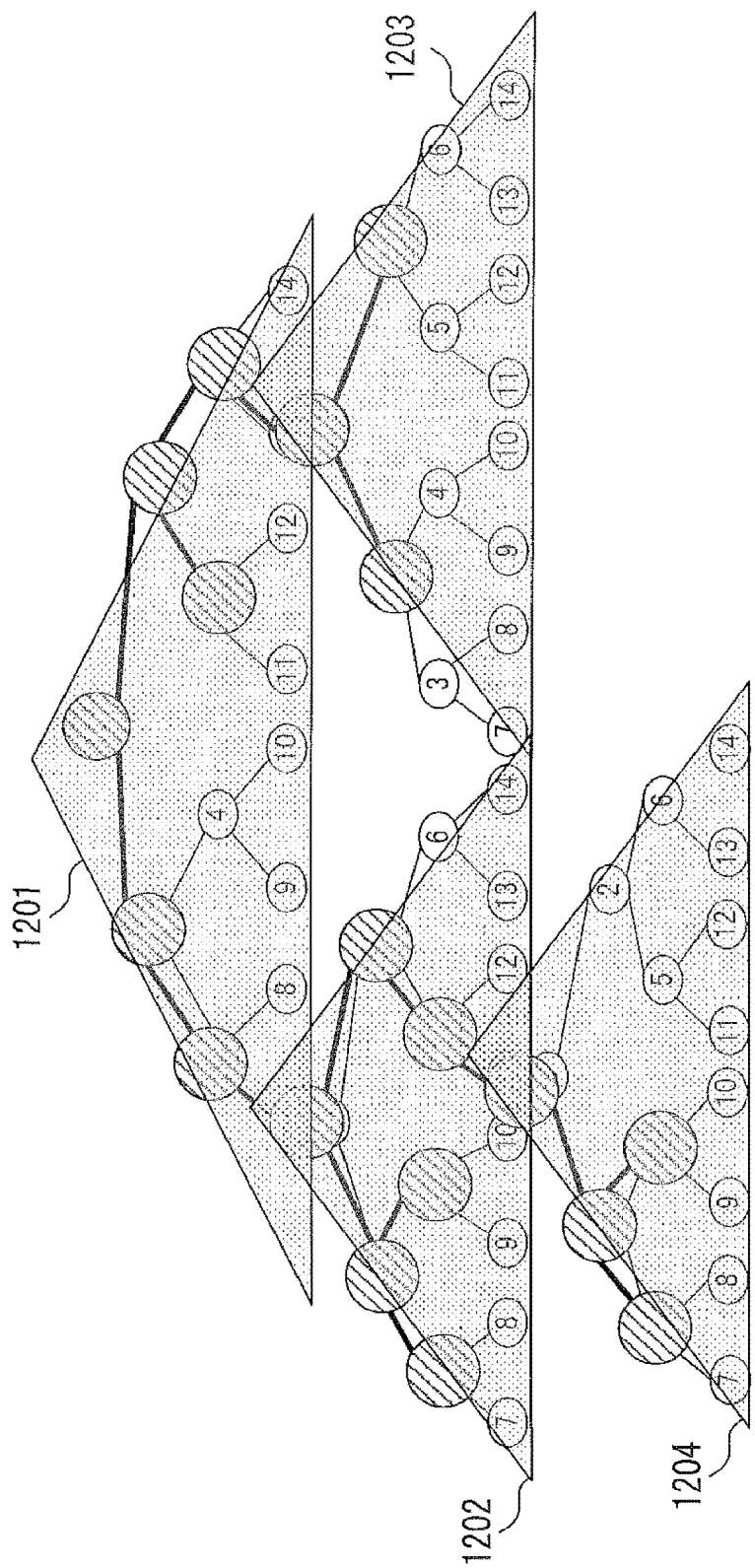
FIG. 12 is a diagram illustrating a syntax tree in which four subtrees are connected.

FIG. 12 illustrates an example of a syntax tree in which four subtrees are connected. A subtree 1202 and a subtree 1203 are subtrees of a child for which a subtree 1201 is used as a parent, and a subtree 1204 is a subtree of a child for which the subtree 1202 is used as a parent.

A root node 0 of the subtree 1202 coincides with a leaf node 7 of the subtree 1201 of a parent, and a root node 0 of the subtree 1203 coincides with a leaf node 13 of the subtree 1201 of a parent. Further, a root node 0 of the subtree 1204 coincides with a leaf node 11 of the subtree 1202 of a parent. By using these four subtrees, for example, the binary tree of nine hierarchies including the following 19 nodes can be described.

Subtree 1201: node 0 to node 3, node 5 to node 7, node 13
Subtree 1202: node 1 to node 5, node 11
Subtree 1203: node 1, node 2
Subtree 1204: node 1, node 3, node 4

As described above, the tree structure of the syntax tree is expressed using a plurality of subtrees, and thereby a syntax tree having a hierarchical structure in which only one portion is deepened can be efficiently stored in the storage unit 611. In this case, the syntax analysis result 812 includes nesting information indicating a connection relationship between the subtree of a parent and that of a child, as well as the syntax information corresponding to each node of the syntax tree. Further, the syntax information corresponding to each node includes information on a position of a node and information on a sentence, a phrase, a part of speech, etc. expressed by the node.

When the syntax tree is not a binary tree, the syntax tree is converted into a binary tree to thereby apply the fundamental form to the syntax tree. For example, when one node has three or four branches, dummy nodes of one hierarchy are inserted into the syntax tree to thereby convert the syntax tree into a binary tree. In addition, when one node has five to eight branches, dummy nodes of two hierarchies are inserted into the syntax tree to thereby convert the syntax tree into a binary tree.

Figure 13:
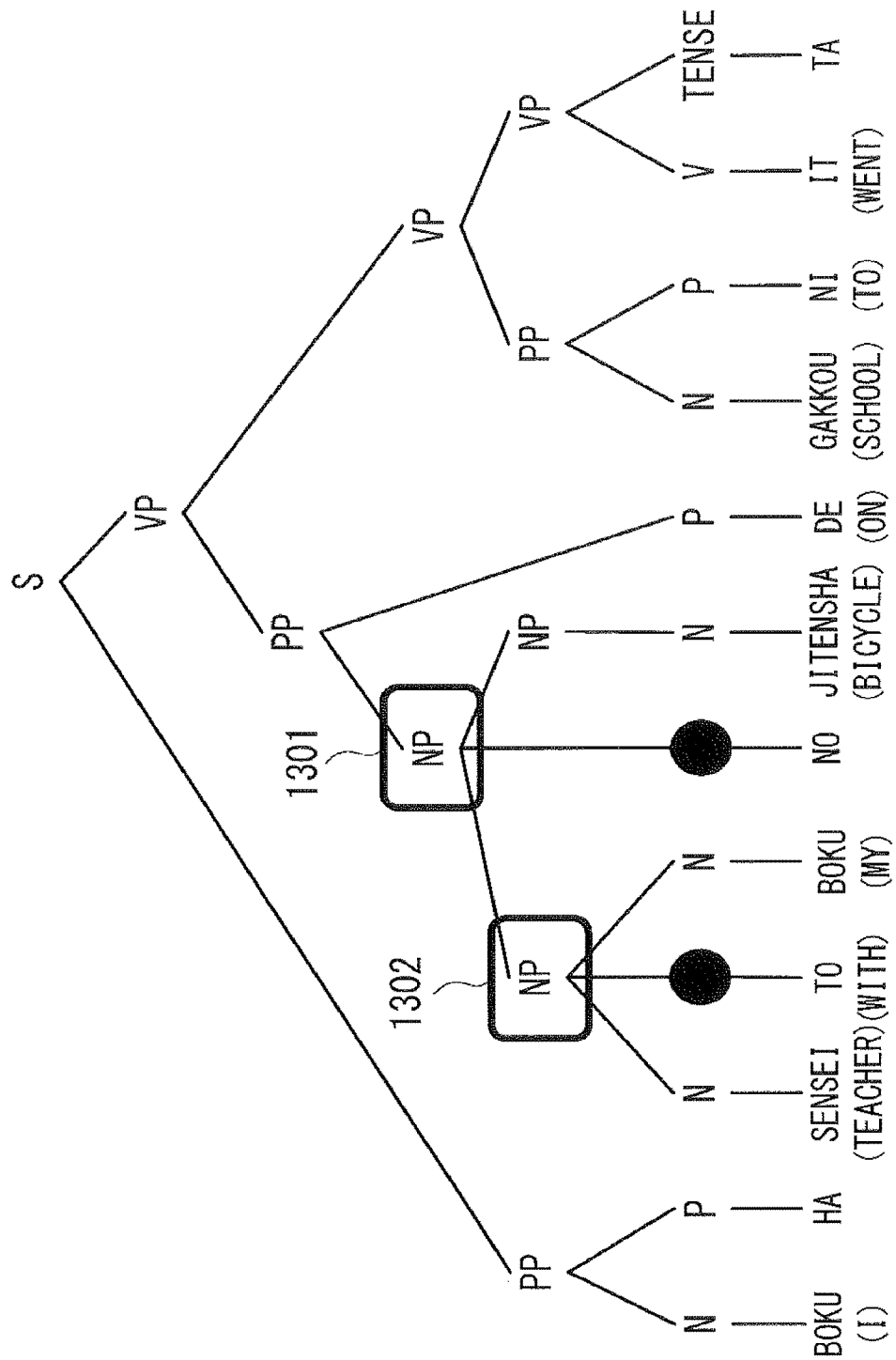
FIG. 13 is a diagram illustrating a syntax tree in which a node has three branches.

FIG. 13 illustrates an example of the syntax tree in which one node has three branches. The syntax tree of FIG. 13 expresses the syntax analysis result of a Japanese sentence of "bokuhasenseitobokunojitenshadegakkouniitta" (I went to school on my bicycle with a teacher). Herein, "PP" represents a prepositional phrase or a postpositional phrase, "P" represents a preposition or a postposition, and "TENSE" represents a tense.

Among three branches of NP 1301, one branch corresponds to a leaf node of a word "no", and the other two branches correspond to other NPs. Further, among three branches of NP 1302, one branch corresponds to a leaf node of a word "to" (with), and the other two branches correspond to leaf nodes N. In this case, it is considered that each leaf node of the word "to" (with) and the word "no" expresses a part of speech of a conjunctive particle etc.

Figure 14:
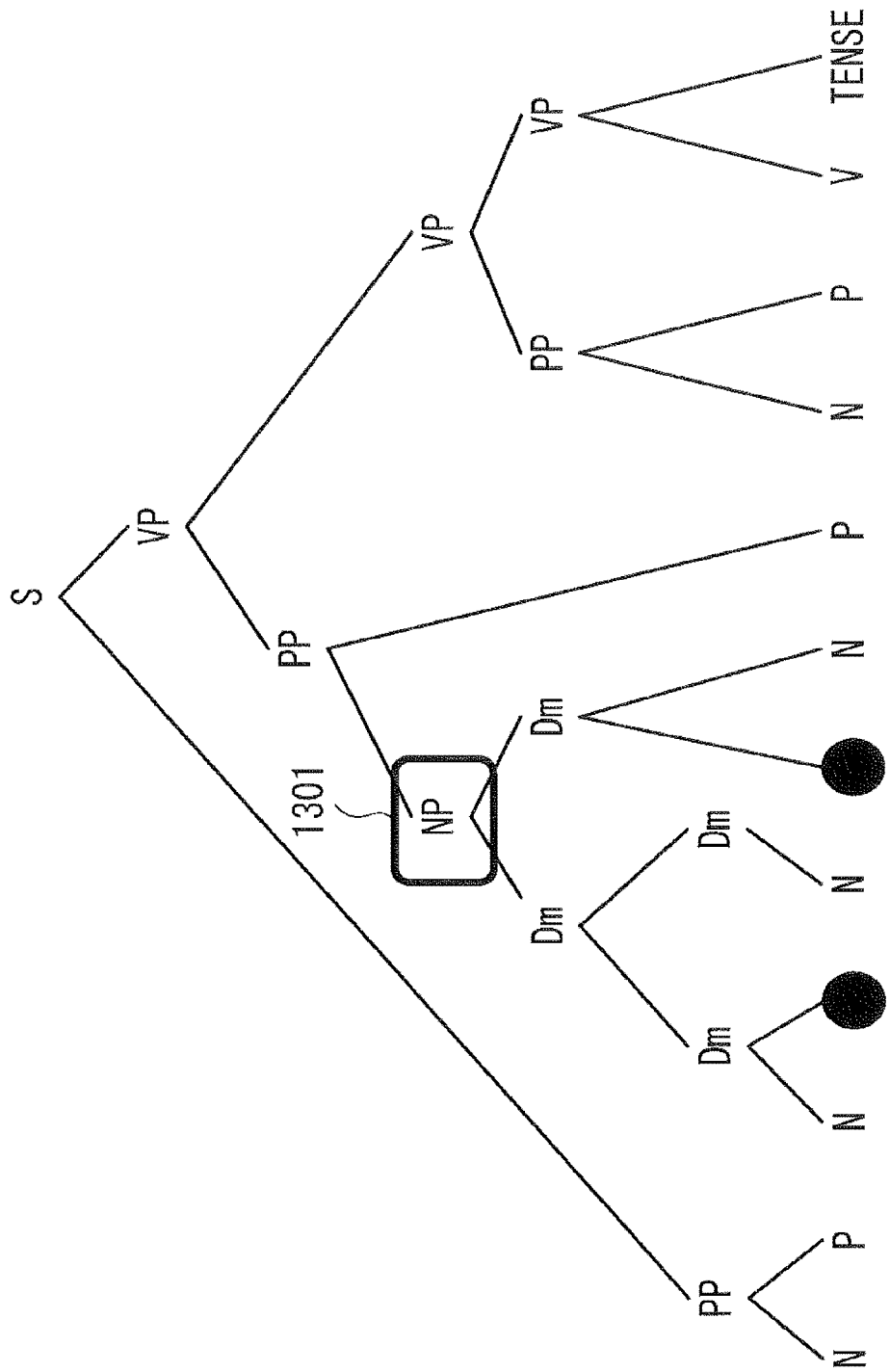
FIG. 14 is a diagram illustrating a binary tree corresponding to the syntax tree in which the node has three branches.

FIG. 14 illustrates an example of the binary tree corresponding to the syntax tree of FIG. 13. In this example, two dummy nodes Dm are provided under the NP 1301, and two dummy nodes Dm are further provided under one dummy node Dm, and thereby the number of branches is reduced from three pieces to two pieces.

Figure 15:
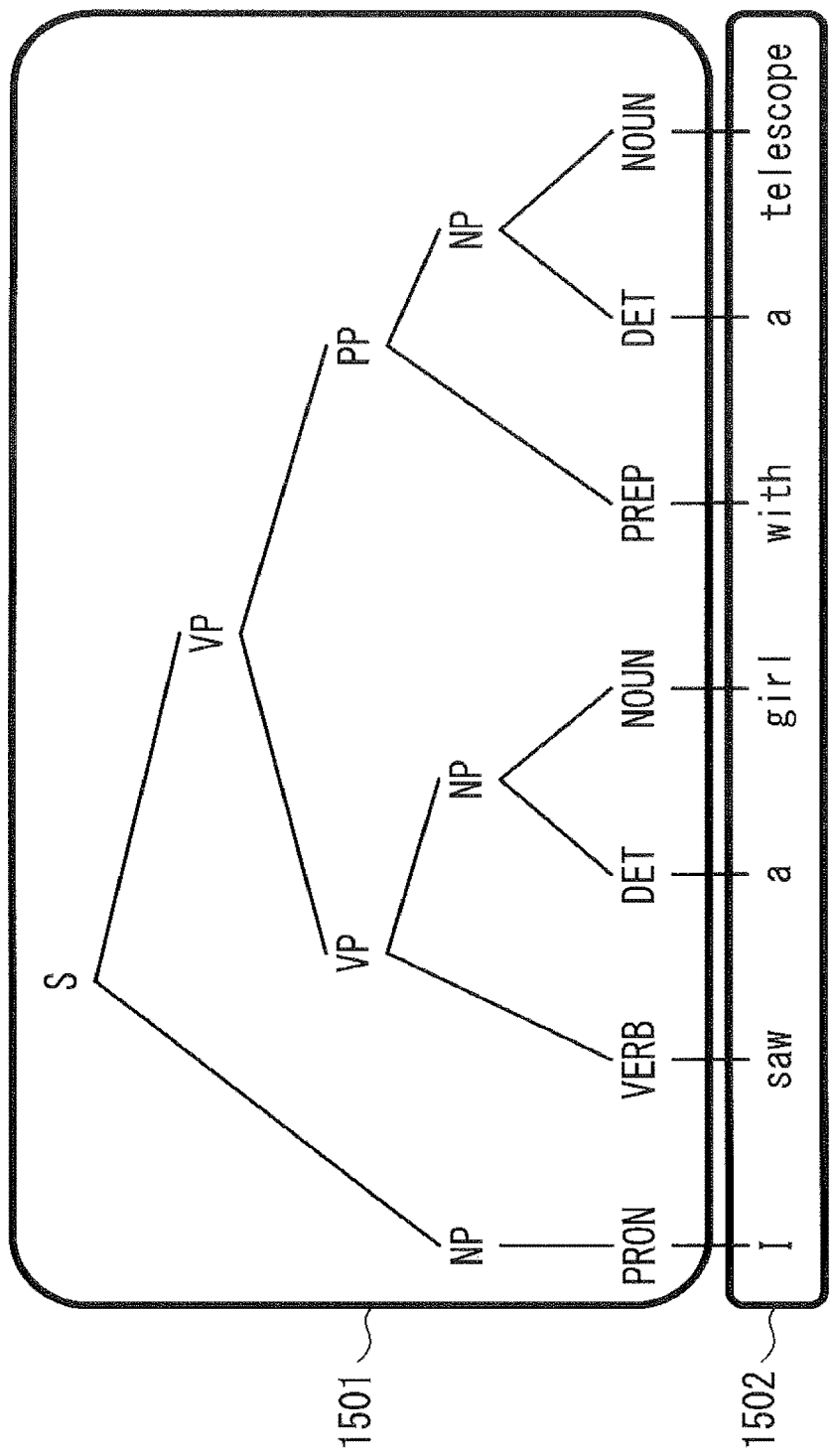
FIG. 15 is a diagram illustrating a syntax tree of an English sentence.

FIG. 15 illustrates an example of the syntax tree of an English sentence. A syntax tree 1501 of FIG. 15 expresses the syntax analysis result of a sentence 1502 of "I saw a girl with a telescope". Herein, "PRON" of a leaf node of the syntax tree 1501 represents a pronoun, "VERB" represents a verb, "DET" represents a determiner, "NOUN" represents a noun, and "PREP" represents a preposition or a postposition. With respective leaf nodes, words extracted from among the sentence 1502 using the lexical analysis are associated.

The encoding unit 613 refers to the word dictionary 813 and the code table 814, and assigns the compression code to each word included in each sentence within the compression target document and to the syntax information and the nesting information included in the syntax analysis result 812 (step 903). Then, the encoding unit 613 stores in the storage unit 611 the compression codes assigned to the word, the syntax information, and the nesting information as a word code 815, a syntax code 816, and a nesting code 817, respectively.

In the code table 814, correspondence relationships are registered between the word, the syntax information and the nesting information, and the compression codes. Examples of the compression codes include a fixed-length code from 1 byte to 5 bytes. Examples of the above-described compression codes are described below using hexadecimal numbers.

Alphanumeric characters: 00h to 7Fh (1 byte)
CJK characters: A00000h to AFFFFFh (3 bytes)
English words: B00000h to B7FFFFh (3 bytes)

Connected words in English: B8000000h to BFFFFFFFh (4 bytes)
Japanese words: C00000h to C7FFFFh (3 bytes)
Connected words in Japanese: C0000000h to CFFFFFFFh (4 bytes)
Words of the third language: D00000h to D7FFFFh (3 bytes)
Connected words of the third language: D8000000h to DFFFFFFFh (4 bytes)
4-digit numerical values: E00000h to E3FFFFh (3 bytes)
6-digit numerical values: E000000h to E4FFFFFFh (4 bytes)
9-digit numerical values: E500000000h to E8FFFFFFFFh (5 bytes)
Syntax information and nesting information: F00000h and greater (3 bytes)

The compression codes assigned to a 4-digit numerical value and a 6-digit numerical value also include a code for sorting options in an expression of numerical values, such as whether "," is inserted into a decimal numerical value for every 3 digits, the decimal numerical value is a positive number or a negative number, or the like.

Among the compression codes of 3 bytes assigned to the word, the syntax information, and the nesting information, an upper 4 bits are used for identifying a code type. For example, "C" represents a Japanese word and "F" represents the syntax information or the nesting information. The remaining 20 bits are used for identifying the individual word, syntax information, and nesting information.

The above-described compression code is merely one example. Further, the compression code may be assigned to the word, the syntax information, and the nesting information using another method. The compression code may be a fixed-length code of another size, or may be a variable-length code.

FIG. 16 illustrates an example of the code table 814. Each entry of the code table 814 of FIG. 16 includes the compression code and an ID for identifying the word, the syntax information, and the nesting information. The word ID of FIG. 10 is used as the ID of the word, and an ID that does not overlap the word ID is used as the ID of the syntax information and the nesting information. For example, the compressed code of the word "sakura" (cherry blossoms) corresponding to the word ID "1" is "C01234h".

The encoding unit 613 replaces the word, the syntax information, and the nesting information with the corresponding compression code of the code table 814. Thereby, the word code 815, the syntax code 816, and the nesting code 817 can be generated. In addition, information on the word dictionary 813 and information on the code table 814 can be managed collectively.

In the compression code of 3 bytes assigned to the syntax information and the nesting information, breakdowns of a lower 20 bits are as follows.

4 bits: the number of a node within the binary tree of the fundamental form
8 bits: an ID of the binary tree including the node
8 bits: information on a sentence, a phrase, a part of speech, etc. expressed by the node, or the ID of the binary tree of a child FIG. 17 illustrates an example of the least significant 8 bits of the compression codes with respect to the syntax information and the nesting information. In this example, "0x00", "0x01", "0x02", "0x03", "0x04", "0x05", "0x06", and "0x07" are assigned to "S", "NP", "VP", "PP", "N", "V", "P", and "D", respectively. "D" represents a determiner. A code of "0x20" or more is assigned to the ID of the binary tree of a child.

Figure 18:
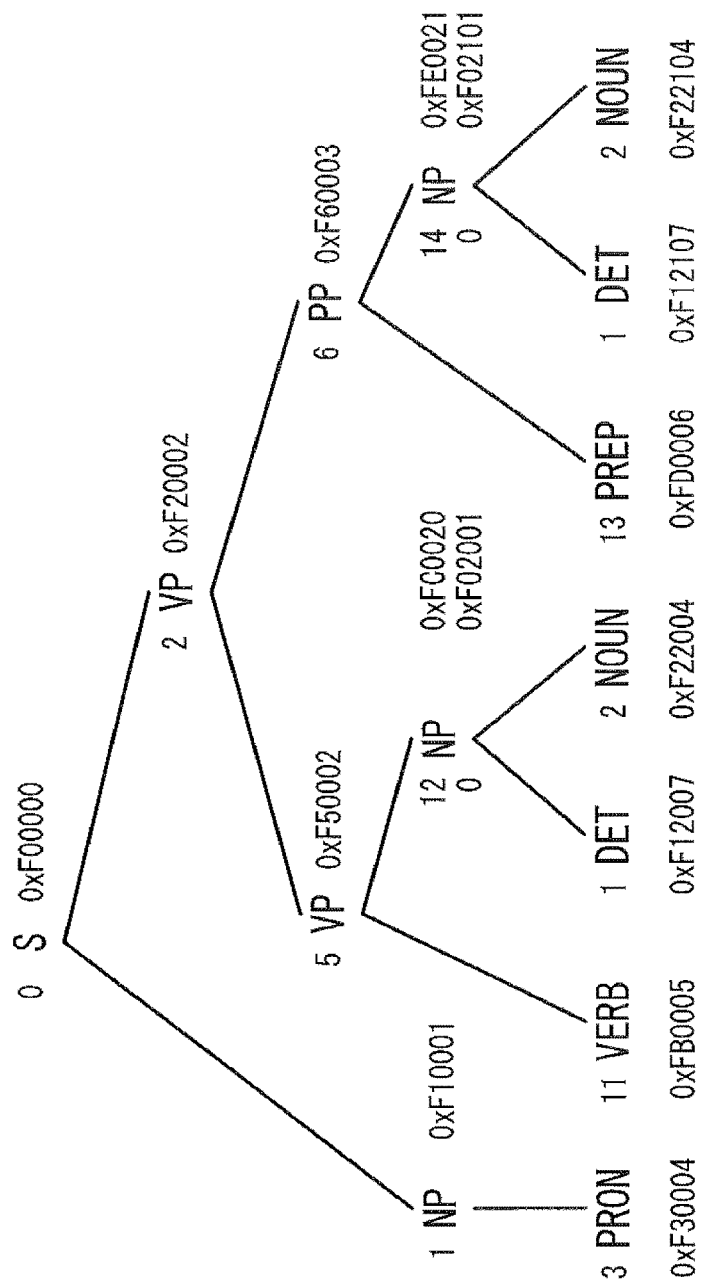
FIG. 18 is a diagram illustrating the syntax code and the nesting code with respect to the syntax tree.

FIG. 18 illustrates an example of the compression codes assigned to the syntax information and the nesting information of the syntax tree of FIG. 15. This syntax tree is generated by connecting a root node 0 of the binary tree of a child to each position of leaf nodes 12 and 14 of the binary tree of a parent. The ID of the binary tree of the parent is "0x00", the ID of the binary tree of the child connected to the leaf node 12 is "0x20", and the ID of the binary tree of the child connected to the leaf node 14 is "0x21".

For example, a syntax code "0xF00000" is assigned to the syntax information of S located at the root node 0 of the binary tree of the parent. Further, a syntax code "0xF10001" is assigned to the syntax information of NP located at the node 1.

In addition, a syntax code "0xF30004" is assigned to the syntax information of PRON located at a leaf node 3 of the binary tree of the parent. In the syntax code "0xF30004", "F" (4 bits) at the head represents the syntax information, "3" (4 bits) coming next represents the number of the node 3, "00" (8 bits) coming next represents the ID of the binary tree, and "04" (8 bits) at the tail represents N (a noun).

The syntax information on NP and the nesting information indicating the binary tree of the child are present in the lead node 12 of the binary tree of the parent. In these, a nesting code "0xFC0020" is assigned to the nesting information, and a syntax code "0xF02001" is assigned to the syntax information of NP.

In the nesting code "0xFC0020", "F" at the head represents the nesting information, "C" coming next represents the number of the node 12, "00" coming next represents the ID of the binary tree, and "20" at the tail represents the ID of the binary tree of the child. Further, in the syntax code "0xF02001", "F" at the head represents the syntax information, "0" coming next represents the number of the root node 0 of the binary tree of the child, "20" coming next represents the ID of the binary tree of the child, and "01" at the tail represents NP (a noun phrase).

Similarly, the syntax information on NP and the nesting information indicating the binary tree of the child are present in the lead node 14 of the binary tree of the parent. In these, the nesting code "0xFE0021" is assigned to the nesting information, and the syntax code "0xF02101" is assigned to the syntax information on NP.

In the nesting code "0xFE0021", "F" at the head represents the nesting information, "E" coming next represents the number of the node 14, "00" coming next represents the ID of the binary tree, and "21" at the tail represents the ID of the binary tree of the child. Similarly, in the syntax code "0xF02101", "F" at the head represents the syntax information, "0" coming next represents the number of the root node 0 of the binary tree of the child, "21" coming next represents the ID of the binary tree of the child, and "01" at the tail represents NP (a noun phrase).

As described above, the syntax code 816 and the nesting code 817 are assigned to the node for connecting two subtrees. Further, only the syntax codes 816 are assigned to all nodes except the node for connecting two subtrees.

The arrangement unit 614 arranges the word code 815, the syntax code 816, and the nesting code 817 in the prescribed order, generates a compression code string, and outputs the generated compression code string to the information processing apparatus that performs the application processing (step 904). The application processing includes text mining such as an expression search, a neighborhood search, etc. Application processing that cooperates with data mining is also enabled. As the prescribed order, for example, the following order is used.

(1) First Order

The word code 815 assigned to each word is arranged adjacent to the syntax code 816 assigned to the syntax information corresponding to the word.

(2) Second Order

A plurality of the word codes 815 assigned to a plurality of words are arranged adjacent to each other.

Figure 19:
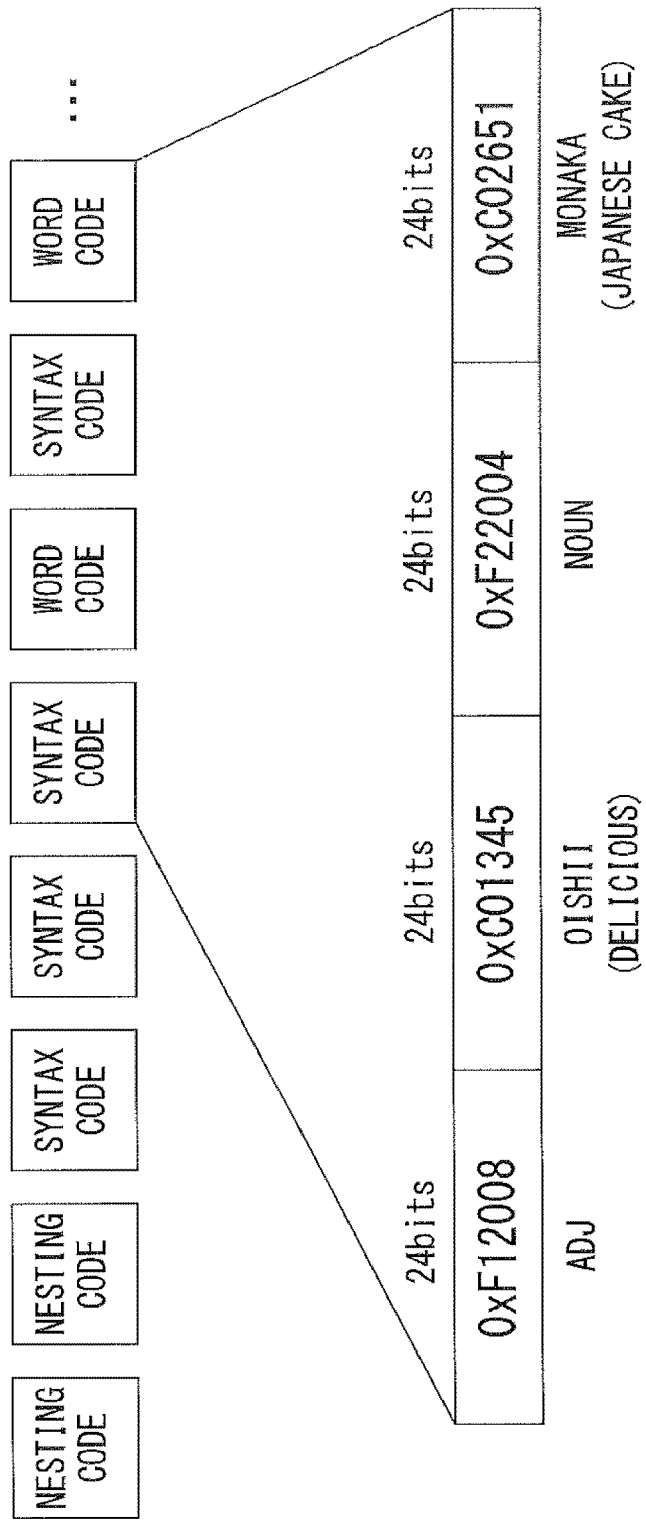
FIG. 19 is a diagram illustrating a compression code string arranged in a first order.

FIG. 19 illustrates an example of the compression code string arranged in the first order. In this example, the nesting codes 817 and the syntax codes 816 other than the leaf nodes are arranged in advance for each sentence. Subsequently, the syntax code 816 of the leaf node is arranged adjacent to the word code 815 of the word corresponding to the leaf node. For example, adjacent to the syntax code "0xF12008" corresponding to the word "oishii" (delicious), the word code 0xC01345 of the word is arranged. Similarly, adjacent to the syntax code "0xF22004" corresponding to the word "monaka" (Japanese cake), the word code "0xC02651" of the word is arranged.

In the application processing for applying the syntax analysis result, the compression codes are arranged in the first order, and thereby each word can be easily associated with the syntax analysis result of the word.

Figure 20:
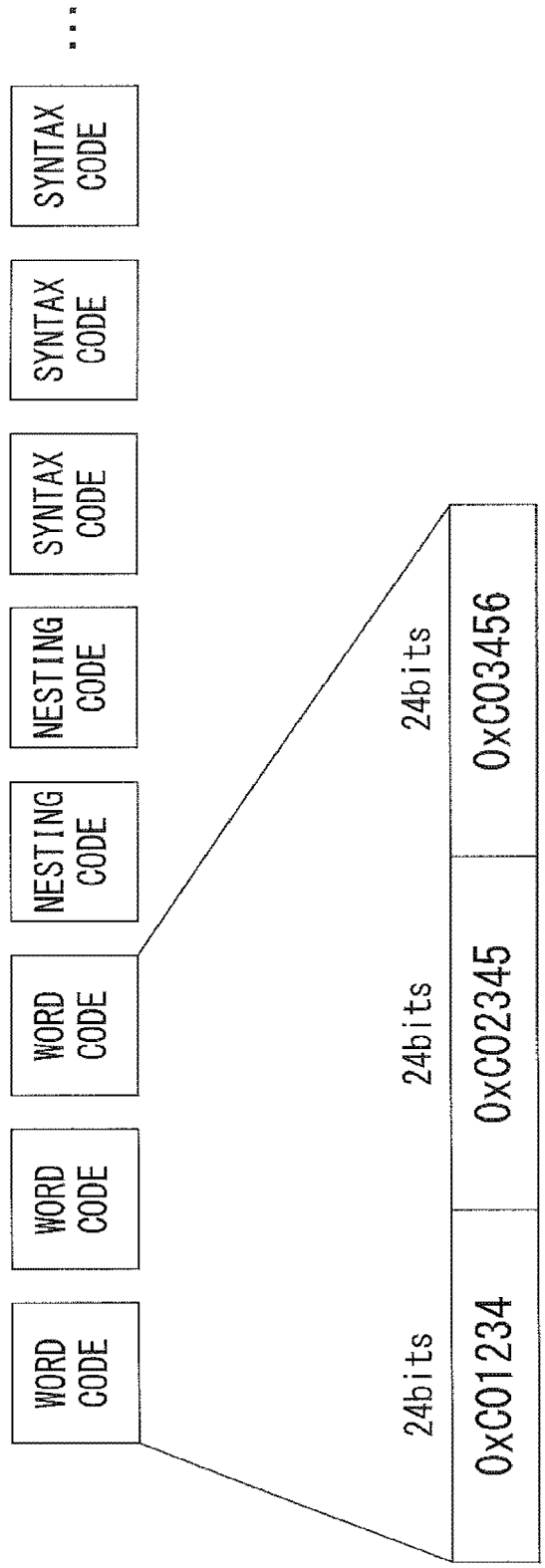
FIG. 20 is a diagram illustrating a compression code string arranged in a second order.

FIG. 20 illustrates an example of the compression code strings arranged in the second order. In this example, the word codes 815 are collectively arranged in advance for each sentence, and subsequently, the nesting codes 817 and the syntax codes 816 are collectively arranged. For example, the word codes "0xC01234", "0xC02345", and "0xC03456" are arranged adjacent to each other.

The compression codes are arranged in the second order, and thereby it becomes possible to efficiently refer to the word codes in the application processing using only the words.

The first order is suitable for application processing such as expression search etc. The expression search is processing for searching for evaluations of users with respect to a particular commodity or product from a large number of documents obtained from social networking services (SNS) or the like on the Internet. A modifier such as an adjective etc. associated with words expressing a commodity name, a product name, a function name, etc., a predicate in an SVC sentence pattern, or the like is extracted to thereby determine evaluations of the users.

Figure 21:
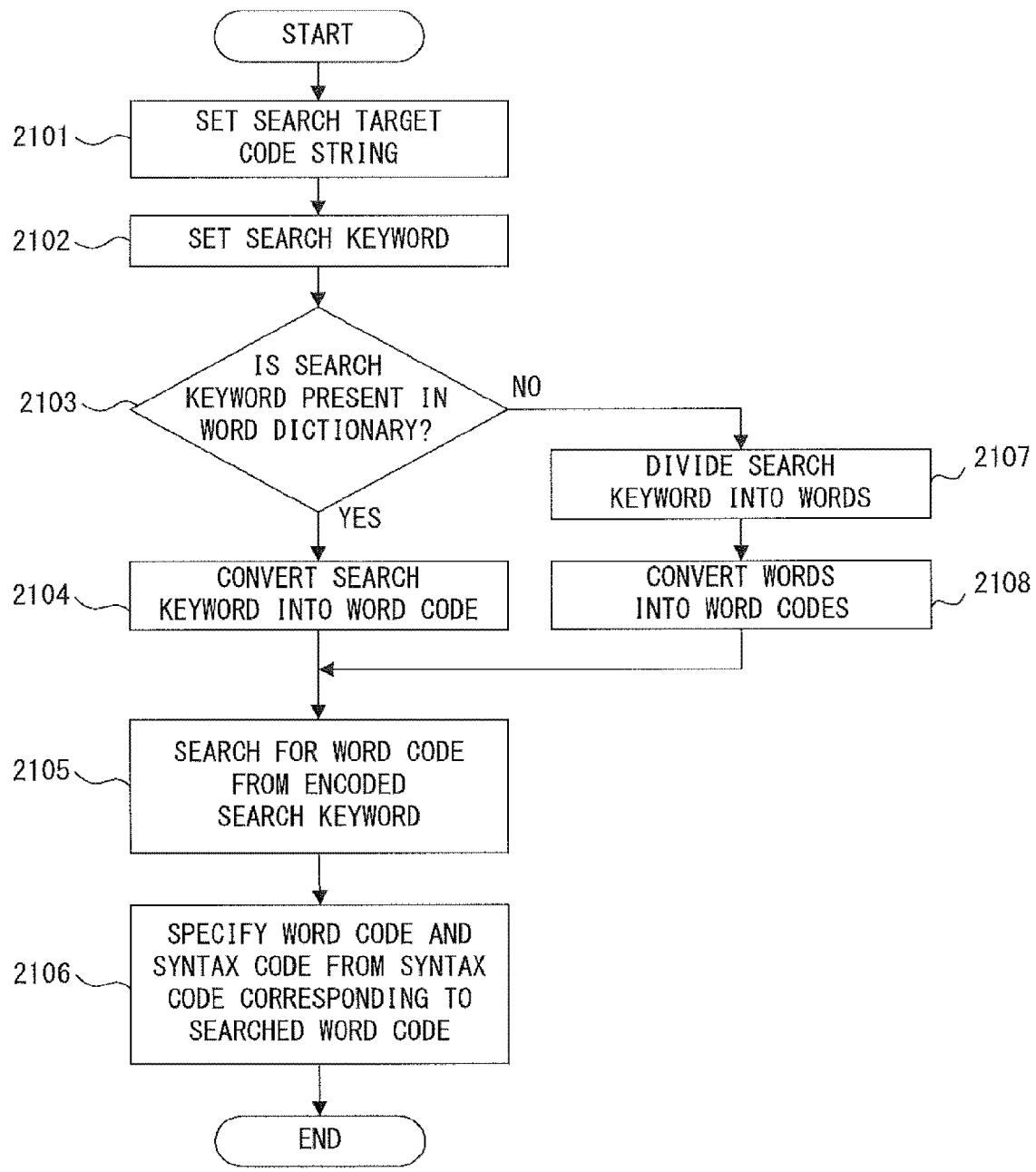
FIG. 21 is a flowchart of an expression search using the compression code string.

FIG. 21 is a flowchart illustrating an example of the expression search using the compression code string. The information processing apparatus that performs the expression search stores the word dictionary 813 and the code table 814.

First, the information processing apparatus sets as the search target code string a compression code string of one or a plurality of documents (step 2101). Then, the information processing apparatus sets as a search keyword a word expressing the commodity name, the product name, the function name, etc. input from an operator (step 2102).

Next, the information processing apparatus checks whether the search keyword is present in the word dictionary 813 (step 2103). If the search keyword is present in the word dictionary 813 (YES in step 2103), the information processing apparatus refers to the word dictionary 813 and the code table 814, and converts the search keyword into a word code (step 2104).

Next, within the search target code string, the information processing apparatus searches for the word code corresponding to the search keyword (step 2105). Next, the information processing apparatus refers to the syntax code adjacent to the searched word code as a syntax code corresponding to the word code (step 2106). Further, the information processing apparatus specifies a word code and a syntax code relating to the searched word code from the referred-to syntax code.

As the word code relating to the searched word code, for example, within the same syntax tree as that of the search keyword, a word code of a phrase for modifying the search keyword or that of a phrase corresponding to the predicate in the SVC sentence pattern is specified. As a phrase for modifying the search keyword, an adjective, an adjective phrase, or the like is specified. For example, a phrase "as in an X" expressed using a noun X is equivalent to the adjective phrase. As a phrase equivalent to the predicate, for example, a subjective complement using as a subject a keyword, an adjective phrase equivalent to the subjective complement, or the like is specified. Then, the information processing apparatus refers to the word dictionary 813 and the code table 814, and converts the specified word code into a phrase.

On the other hand, if the search keyword is not present in the word dictionary 813 (NO in step 2103), the information processing apparatus divides the search keyword into a plurality of words (step 2107). Then, the information processing apparatus refers to the word dictionary 813 and the code table 814, and converts each word into a word code (step 2108). Further, the information processing apparatus performs the process in step 2105 and later.

In the compression code string of FIG. 19, for example, when evaluations for "monaka" (Japanese cake) used as a noun are investigated, "monaka" (Japanese cake) is set as the search keyword. In the compression code string, the word code "0xC02651" of "monaka" (Japanese cake) is searched, and the syntax code "0xF22004" adjacent to the word code is referred to. As a result, the syntax code "0xF12008" including the ID "20" of the binary tree of the referred-to syntax code is specified. Since 8 bits of the tail of this syntax code "0xF12008" express an adjective, the word code "0xC01345" adjacent to the syntax code is specified and converted into the word "oishii" (delicious).

As described above, the syntax code 816 and the word code 815 are arranged adjacent to each other, and thereby a word corresponding to the particular syntax can be searched for quickly from the compression code string.

In place of the word code "0xC02651", using the compression code "0x04C02651" of 32 bits obtained by combining 8 bits of the tail of the syntax code "0xF22004" and the word code "0xC02651", the compression code string can be searched. In this case, since only "monaka" (Japanese cake) as a noun can be specified, accuracy of the expression search is improved.

The second order is suitable for the application processing such as a search or a replacement across a plurality of words, neighborhood search, etc. The search across the plurality of words is processing for searching for a plurality of words from documents, and the replacement across the plurality of words is processing for replacing a portion or all of a plurality of words in documents. For example, in a document in which "saaba" and "saabaa" are mixed, "saabaa" is converted into "saaba" so as to unify the notation. On this occasion, the replacement processing for excluding a proper noun as in an "AAA saabaa" from a unified target is included in the replacement across a plurality of words.

The neighborhood search is processing for searching for another word included in a prescribed range in the vicinity of a certain word. Examples of the neighborhood search include processing for searching for a word "improvement"

included within the ten words in the vicinity of a word "operation" without straddling sentences.

Figure 22:
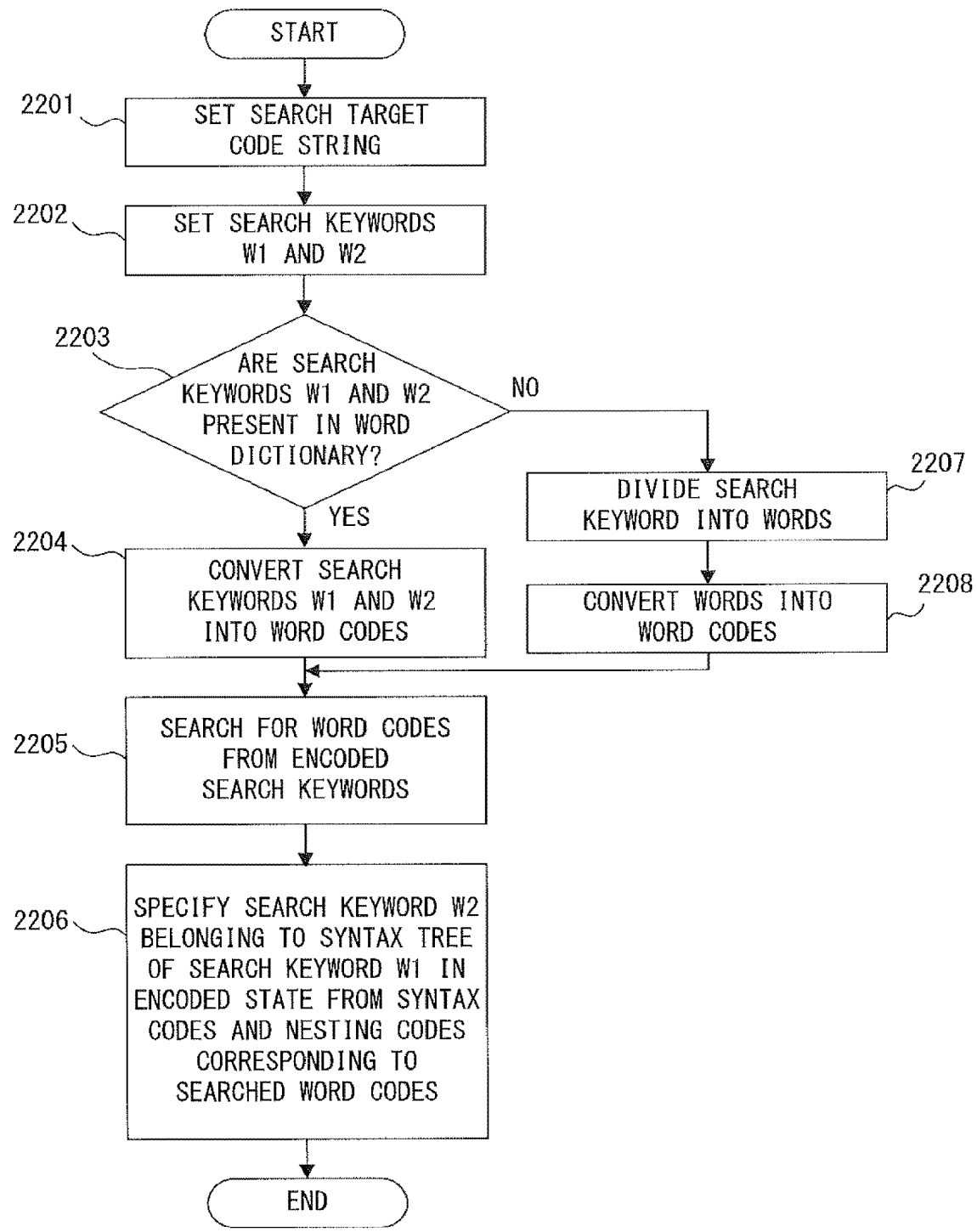
FIG. 22 is a flowchart of a neighborhood search using the compression code string.

FIG. 22 is a flowchart illustrating an example of the neighborhood search using the compression code string. In this example, a search keyword W2 included within M words in the vicinity of a search keyword W1 is searched. The information processing apparatus that performs the neighborhood search stores the word dictionary 813 and the code table 814.

First, the information processing apparatus sets a compression code string of one or a plurality of documents as the search target code string (step 2201). Then, the information processing apparatus sets two words input from the operator as the search keywords W1 and W2 (step 2202).

Next, the information processing apparatus checks whether the search keywords W1 and W2 are present in the word dictionary 813 (step 2203). If the search keywords W1 and W2 are present in the word dictionary 813 (YES in step 2203), the information processing apparatus refers to the word dictionary 813 and the code table 814, and converts each of the search keywords into a word code (step 2204).

Next, within the search target code string, the information processing apparatus searches for the word code corresponding to each of the search keywords (step 2205), and refers to the syntax code and the nesting code corresponding to each of the searched word codes (step 2206). Further, from the referred-to syntax code and nesting code, the information processing apparatus specifies, in the encoded state, the search keyword W2 included within M words in the vicinity belonging to the syntax tree of the search keyword W1, and counts the number of the specified search keywords W2.

On the other hand, if the search keyword W1 or W2 is not present in the word dictionary 813 (NO in step 2203), the information processing apparatus divides the search keyword that is not present in the word dictionary 813 into a plurality of words (step 2207). Then, the information processing apparatus refers to the word dictionary 813 and the code table 814, and converts each of the divided words into a word code (step 2208). Further, the information processing apparatus performs the process in step 2205 and later. In step 2208, the search keyword that is present in the word dictionary 813 is converted into a word code directly.

As described above, the word codes 815 are arranged adjacent to each other while maintaining an order of the words. Thereby, processing for referring mainly to the words and for referring to the syntax information secondarily can be performed quickly.

In accordance with the encoding processing of FIG. 9, the lexical analysis and the syntax analysis are performed when the compression processing is performed, and the syntax analysis result can be applied in the compressed state when the application processing is performed. Therefore, a load of the application processing is reduced with respect to computational resources. In particular, in the information processing apparatus in which the computational resources are small as in a mobile terminal, when the application processing is performed in which quality is improved when the syntax analysis result is applied as in a text to speech, a large effect is expectable.

The lexical analysis and the syntax analysis need not be performed when the application processing is performed, and therefore the compressed document need not be decompressed. Accordingly, as compared with a case where the lexical analysis and the syntax analysis are performed after the compressed document is decompressed, calculation costs of the decompression processing are reduced.

Figure 23:
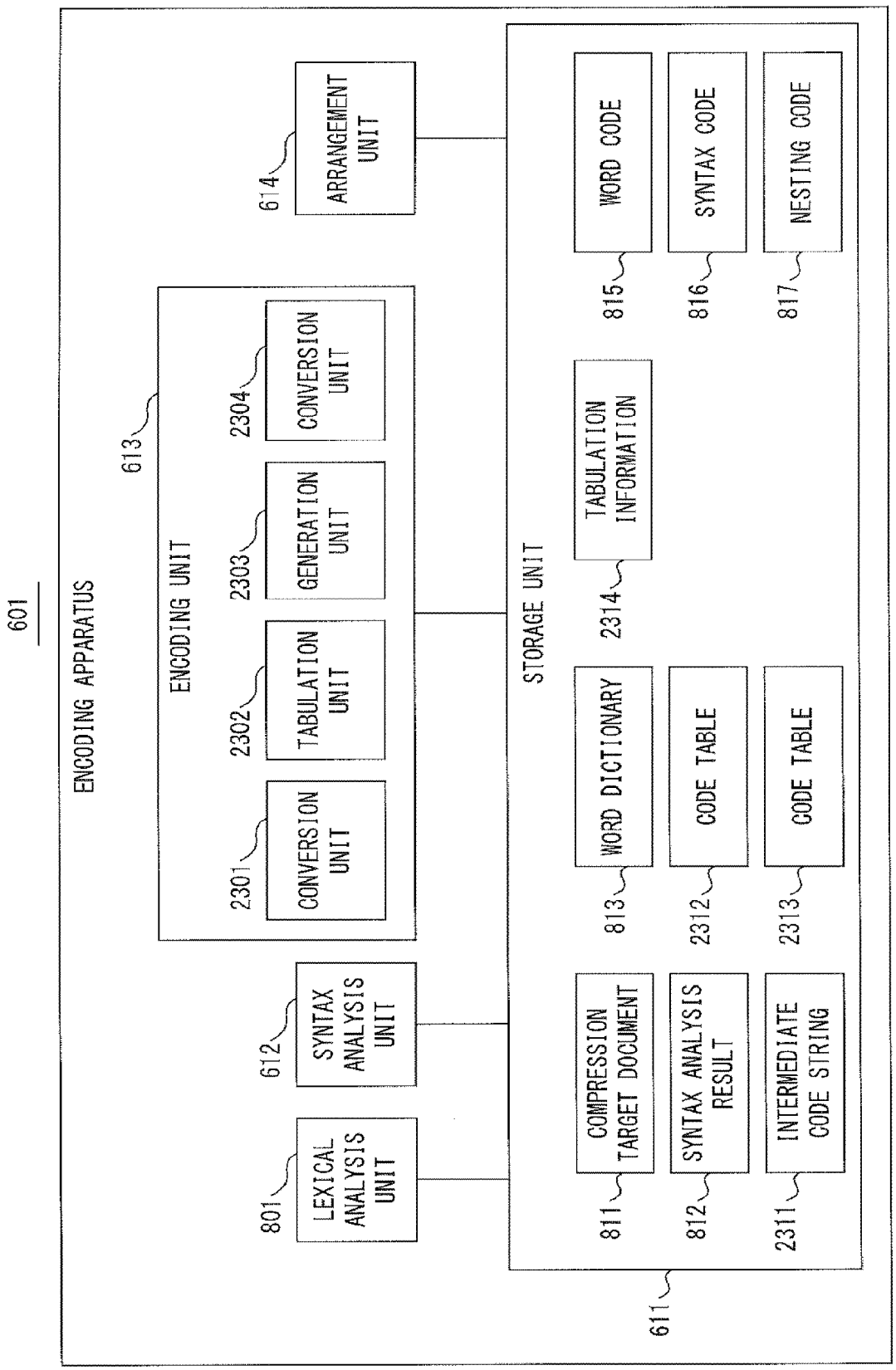
FIG. 23 is a functional block diagram illustrating a second concrete example of the encoding apparatus.

FIG. 23 illustrates a second concrete example of the encoding apparatus 601 of FIG. 6. In the same manner as in the encoding apparatus 601 of FIG. 8, the encoding apparatus 601 of FIG. 23 includes the lexical analysis unit 801, the storage unit 611, the syntax analysis unit 612, the encoding unit 613, and the arrangement unit 614. The encoding unit 613 includes a conversion unit 2301, a tabulation unit 2302, a generation unit 2303, and a conversion unit 2304. When the encoding processing is started, the storage unit 611 stores the compression target document 811, the word dictionary 813, and a code table 2312 of intermediate codes.

Figure 24:
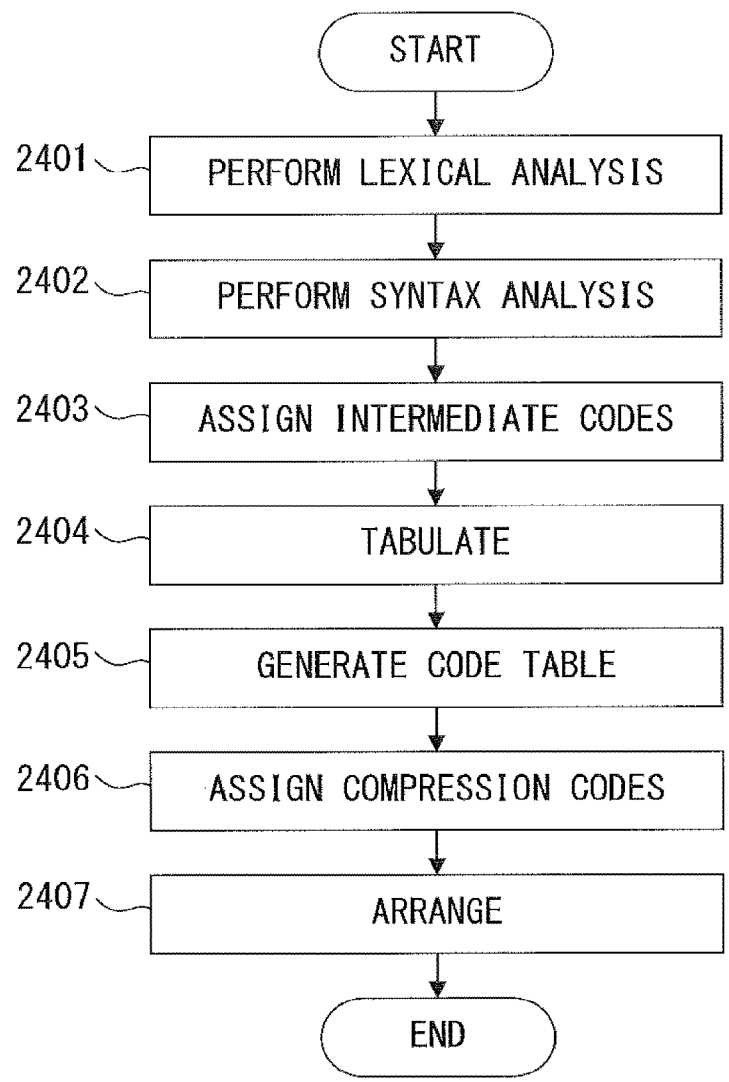
FIG. 24 is a flowchart illustrating the second concrete example of the encoding processing.

FIG. 24 is a flowchart illustrating the second concrete example of the encoding processing of FIG. 7. The encoding processing of FIG. 24 is performed using the encoding apparatus 601 of FIG. 23. The processes in steps 2401 and 2402 of FIG. 24 are the same as those in steps 901 and 902 of FIG. 9.

The conversion unit 2301 of the encoding unit 613 refers to the word dictionary 813 and the code table 2312, and assigns an intermediate code to each word included in each sentence within the compression target document 811 and to the syntax information and the nesting information included in the syntax analysis result 812 (step 2403). Then, the conversion unit 2301 stores in the storage unit 611 the intermediate codes assigned to the words, the syntax information, and the nesting information as an intermediate code string 2311.

FIG. 25 illustrates an example of the code table 2312 of the intermediate codes. Each entry of the code table 2312 of FIG. 25 includes the intermediate code and the ID for identifying the word, the syntax information, and the nesting information. Examples of the intermediate code include the same code as the compression code of FIG. 16.

The tabulation unit 2302 counts the number of times each intermediate code included in the intermediate code string 2311 appears, generates tabulation information 2314, and stores the generated tabulation information 2314 in the storage unit 611 (step 2404). When a plurality of the compression target documents 811 are encoded, the number of times the intermediate code appears is counted document by document.

FIG. 26 illustrates an example of the plurality of the compression target documents 811, and FIG. 27 illustrates an example of the tabulation information 2314 corresponding to the plurality of the compression target documents 811 of FIG. 26. Each entry of the tabulation information 2314 of FIG. 27 includes the document ID of the compression target document 811 and the number of times each intermediate code appears in the intermediate code string 2311 of the compression target document 811. In FIG. 27, the intermediate codes are expressed using the words. In practice, however, the intermediate codes of the word, the syntax information, and the nesting information are identified based on the IDs of FIG. 25.

In the compression target document 811 corresponding to the document ID "1", for example, the words "sakura" (cherry blossoms), "gakkou" (school), and "no" are included one by one, and the word "kaede" (maple) is not included. Further, in the compression target document 811 corresponding to the document ID "2", the words "kaede" (maple), "gakkou" (school), and "no" are included one by one, and the word "sakura" (cherry blossoms) is not included.

Based on the tabulation information 2314, the generation unit 2303 generates the code table 2313 in which a shorter compression code is assigned to information in which the number of appearances is higher, and in which a longer compression code is assigned to information in which the number of appearances is lower (step 2405). At this time, the generation unit 2303 can count the number of appearances for each block of a prescribed size from the number of appearances in each document recorded in the tabulation information 2314, and can generate the suitable code table 2313 based on the number of appearances for each block.

FIG. 28 illustrates an example of the code table 2313 of the compression code. Each entry of the code table 2313 of FIG. 28 includes the compression code and the ID for identifying the word, the syntax information, and the nesting information. Information on the word dictionary 813 and that on the code tables 2312 and 2313 can be managed collectively.

The conversion unit 2304 refers to the word dictionary 813 and the code table 2313, and assigns the compression code to each word included in each sentence within the compression target document 811 and to the syntax information and the nesting information included in the syntax analysis result 812 (step 2406). Further, the conversion unit 2304 stores, in the storage unit 611, the compression codes assigned to the word, the syntax information, and the nesting information as the word code 815, the syntax code 816, and the nesting code 817, respectively.

The arrangement unit 614 arranges the word code 815, the syntax code 816, and the nesting code 817 in the prescribed order, generates a compression code string, and outputs the generated compression code string and the tabulation information 2314 to the information processing apparatus that performs the application processing (step 2407). As the prescribed order, for example, the above-described first order or second order is used.

In accordance with the encoding processing of FIG. 24, in the same manner as in the encoding processing of FIG. 9, a load of the application processing is reduced. Further, the compression code string of the compression target document 811 and the tabulation information 2314 are output in association with each other, and therefore a management of their information can be unified. By using the syntax analysis results and the tabulation information 2314 collectively, accuracy of the application processing is improved, and at the same time, the application processing is sped up.

Figure 29:
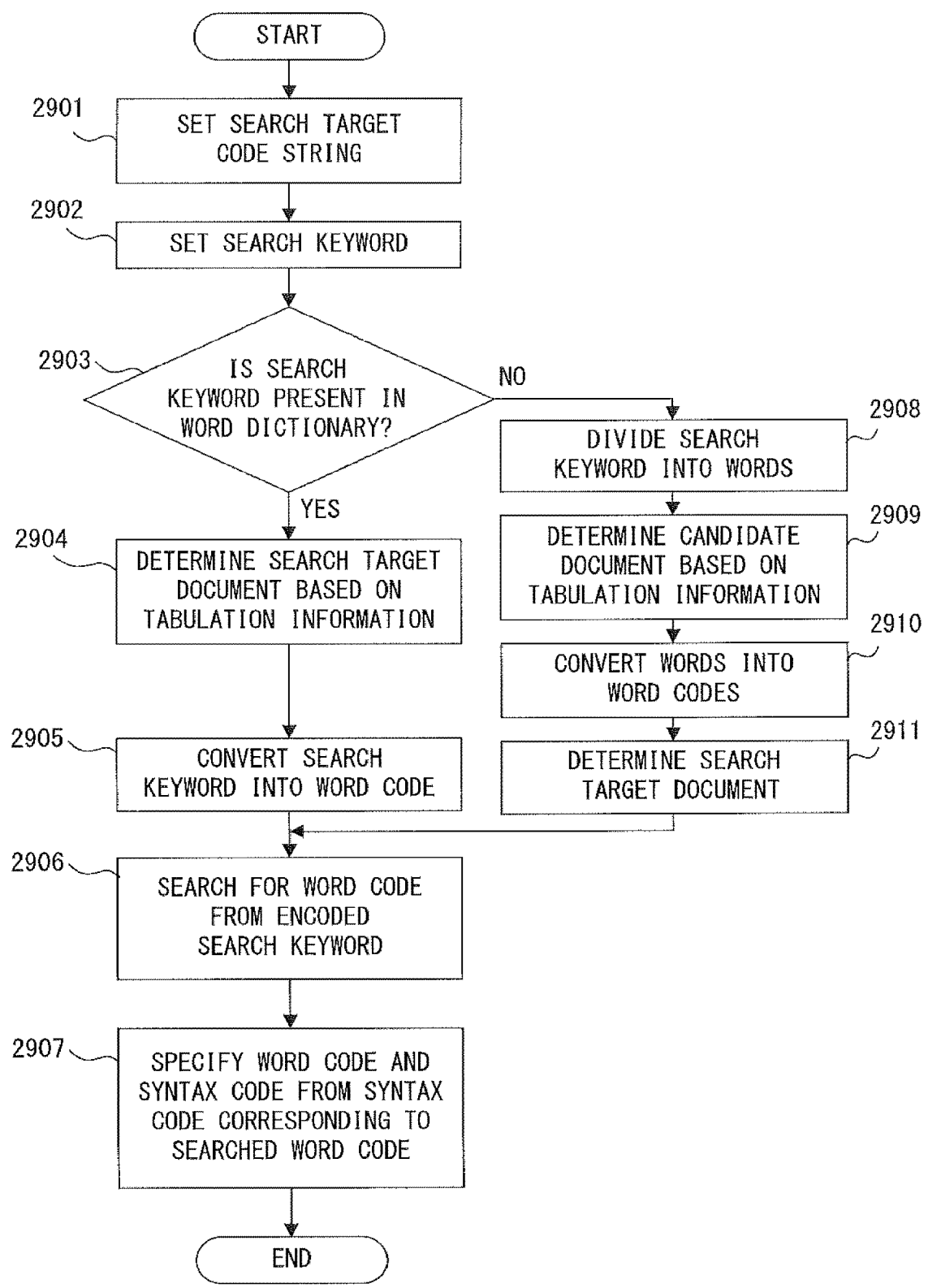
FIG. 29 is a flowchart of the expression search using the compression code string and the tabulation information.

FIG. 29 is a flowchart illustrating an example of the expression search using the compression code string and the tabulation information 2314. The information processing apparatus that performs the expression search stores the word dictionary 813 and the code tables 2312 and 2313.

First, the information processing apparatus sets a compression code string of a plurality of documents as the search target code string (step 2901). Then, the information processing apparatus sets as the search keyword a word such as a commodity name, a product name, a function name, etc. input from the operator (step 2902).

Next, the information processing apparatus checks whether the search keyword is present in the word dictionary 813 (step 2903). If the search keyword is present in the word dictionary 813 (YES in step 2903), the information processing apparatus determines the search target document based on the tabulation information 2314 (step 2904). At this time, from among the documents registered in the tabulation information 2314, the information processing apparatus can select, as the search target document, one or a plurality of documents including the search keyword.

Next, the information processing apparatus refers to the word dictionary 813 and the code table 2313, and converts the search keyword into the word code (step 2905). Then, within the search target code string, the information processing apparatus searches for the word code corresponding to the search keyword (step 2906). Next, the information processing apparatus refers to the syntax code adjacent to the searched word code as the syntax code corresponding to the word code, and specifies the syntax code and the word code relating to the searched word code from the referred-to syntax code (step 2907). Then, the information processing apparatus refers to the word dictionary 813 and the code table 2313, and converts the specified word code into a phrase.

On the other hand, if the search keyword is not present in the word dictionary 813 (NO in step 2903), the information processing apparatus divides the search keyword into a plurality of words (step 2908). Next, the information processing apparatus determines a candidate document based on the tabulation information 2314 (step 2909). At this time, from among the documents registered in the tabulation information 2314, the information processing apparatus can select, as the candidate document, one or a plurality of documents including all of the plurality of words obtained by dividing the search keyword.

Next, the information processing apparatus refers to the word dictionary 813 and the code table 2313, and converts each word into the word code (step 2910). Then, from among the compression code strings of the candidate documents, the information processing apparatus extracts a compression code string including each word code of the search keyword, and determines the candidate document as the search target document (step 2911). Further, the information processing apparatus performs the process in step 2906 and later.

In accordance with the expression search of FIG. 29, the search target documents can be effectively narrowed down based on the tabulation information 2314.

Figure 30:
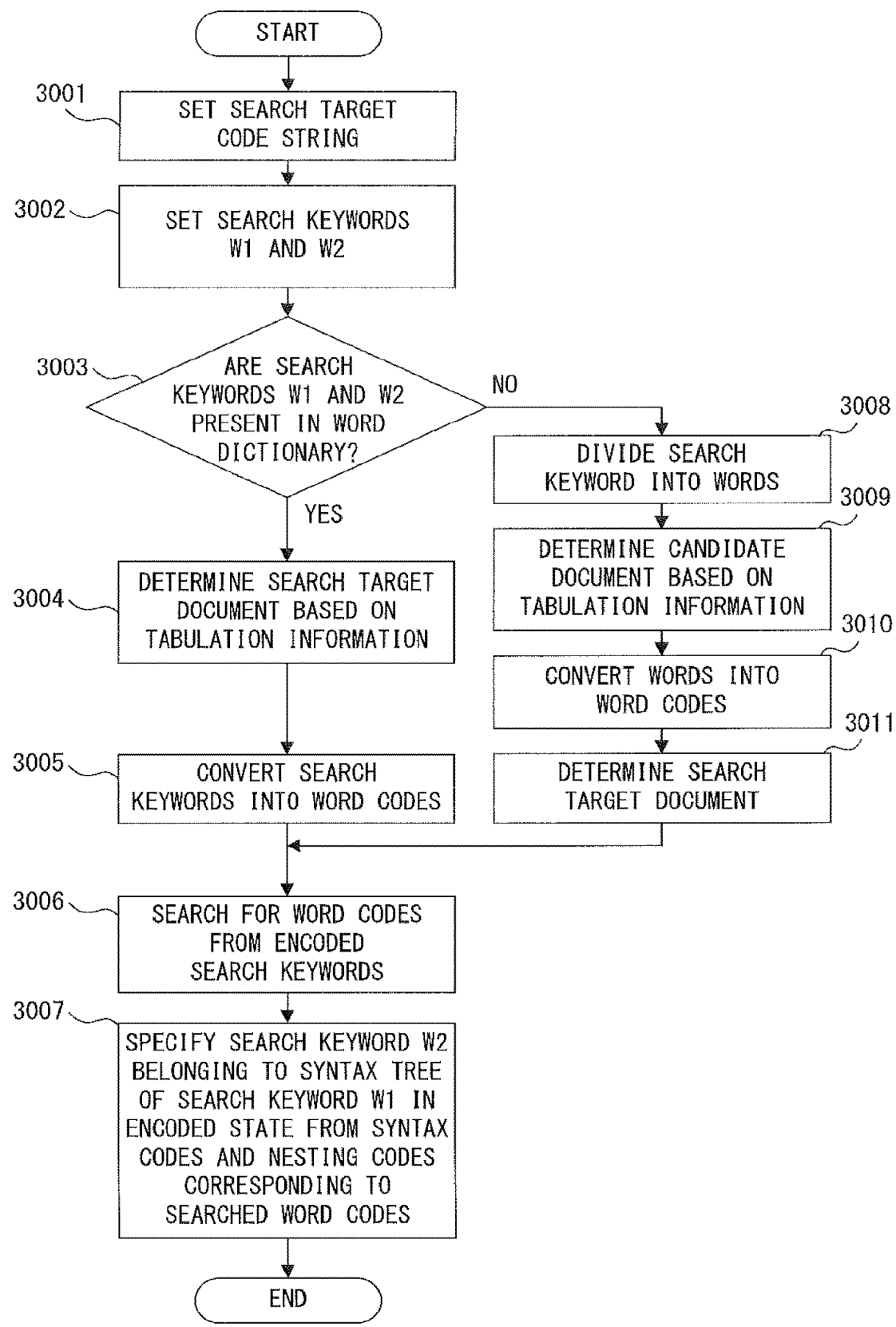
FIG. 30 is a flowchart of the neighborhood search using the compression code string and the tabulation information.

FIG. 30 is a flowchart illustrating an example of the neighborhood search using the compression code strings and the tabulation information 2314. The information processing apparatus that performs the neighborhood search stores the word dictionary 813 and the code tables 2312 and 2313.

First, the information processing apparatus sets a compression code string of a plurality of documents as the search target code string (step 3001). Then, the information processing apparatus sets two words input from the operator as the search keywords W1 and W2 (step 3002).

Next, the information processing apparatus checks whether the search keywords W1 and W2 are present in the word dictionary 813 (step 3003). If the search keywords W1 and W2 are present in the word dictionary 813 (YES in step 3003), the information processing apparatus determines the search target document based on the tabulation information 2314 (step 3004). At this time, from among the documents registered in the tabulation information 2314, the information processing apparatus can select, as the search target document, one or a plurality of documents including the search keywords W1 and W2.

Next, the information processing apparatus refers to the word dictionary 813 and the code table 2313, and converts each of the search keywords into a word code (step 3005). Next, within the search target code string, the information processing apparatus searches for the word code corresponding to each of the search keywords (step 3006). Then, the information processing apparatus refers to the nesting code and the syntax code corresponding to each of the searched word codes (step 3007). Further, from the referred-to syntax code and nesting code, the information processing apparatus specifies, in the encoded state, the search keyword W2 included within M words in the vicinity belonging to the syntax tree of the search keyword W1, and counts the number of the specified search keywords W2.

On the other hand, if the search keyword W1 or W2 is not present in the word dictionary 813 (NO in step 3003), the information processing apparatus divides the search keyword that is not present in the word dictionary 813 into a plurality of words (step 3008). Next, the information processing apparatus determines a candidate document based on the tabulation information 2314 (step 3009). At this time, from among the documents registered in the tabulation information 2314, the information processing apparatus can select, as the candidate document, one or a plurality of documents including all of the plurality of words obtained by dividing the search keyword.

Further, the information processing apparatus refers to the word dictionary 813 and the code table 2313, and converts each of the divided words into a word code (step 3010). At this time, the search keyword that is present in the word dictionary 813 is converted into a word code directly.

Then, from among the compression code strings of the candidate documents, the information processing apparatus extracts the compression code string including each word code of the search keywords W1 and W2, and determines the candidate document as the search target document (step 3011). Further, the information processing apparatus performs the process in step 3006 and later.

In accordance with the neighborhood search of FIG. 30, in the same manner as in the expression search of FIG. 29, the search target documents can be effectively narrowed down based on the tabulation information 2314.

The configurations of the encoding apparatuses 601 of FIGS. 6, 8, and 23 are merely one example and a portion of the components may be omitted or changed in accordance with usages or conditions of the encoding apparatuses 601. In the encoding apparatuses 601 of FIGS. 8 and 23, for example, when the lexical analysis result of the compression target document 811 is stored in advance in the storage unit 611, the lexical analysis unit 801 can be omitted.

The flowcharts of FIGS. 7, 9, 21, 22, 24, 29, and 30 are merely one example, and a portion of the processes may be omitted or changed in accordance with the configurations or conditions of the encoding apparatuses 601 or the information processing apparatus that performs the application processing. In the encoding processing of FIG. 9 or 24, for example, when the lexical analysis result of the compression target document 811 is stored in advance in the storage unit 611, the process in step 901 or 2401 can be omitted.

In the expression search of FIG. 21, when the search keyword is necessarily present in the word dictionary 813, the processes in steps 2103, 2107, and 2108 can be omitted. In the neighborhood search of FIG. 22, when the search keywords W1 and W2 are necessarily present in the word dictionary 813, the processes in steps 2203, 2207, and 2208 can be omitted.

In the expression search of FIG. 29, when the search keyword is necessarily present in the word dictionary 813, the processes in step 2903 and in steps 2908 to 2911 can be omitted. In the neighborhood search of FIG. 30, when the search keywords W1 and W2 are necessarily present in the word dictionary 813, the processes in step 3003 and in steps 3008 to 3011 can be omitted.

The expression search and the neighborhood search are merely one example of the application processing, and the information processing apparatus may perform another application processing, such as a search or a replacement across a plurality of words, a text to speech, a causal relation analysis, and the like.

The word dictionary of FIG. 10, the code tables of FIGS. 16, 25, and 28, the compression target document of FIG. 26, and the tabulation information of FIG. 27 are merely one example. Accordingly, another word dictionary, code table, or compression target document, or other tabulation information may be used in accordance with the configurations or conditions of the encoding apparatuses 601.

The syntax tree of the fundamental form of FIG. 11 is merely one example, and another fundamental form may be used in accordance with the configurations or conditions of the encoding apparatuses 601. The syntax tree of the fundamental form may be the binary tree of three hierarchies or less including fewer nodes, or may be the binary tree of five hierarchies or more including more nodes. The syntax tree of the fundamental form need not be the binary tree.

The syntax tree of FIG. 12 is merely one example, and a combination of other subtrees may be used in accordance with the configurations or conditions of the encoding apparatuses 601. The syntax tree may be the binary tree including fewer subtrees, or may be the binary tree including more subtrees. Each subtree need not have the same shape. The syntax tree need not be the binary tree.

The syntax trees of FIGS. 13, 14 and 15 are merely one example, and the syntax tree of the syntax analysis result changes in accordance with an analysis target sentence. The analysis target sentence may be a sentence of languages other than Japanese and English.

The syntax codes and the nesting codes of FIGS. 17 and 18 are merely one example, and another syntax code or nesting code may be used in accordance with the configurations or conditions of the encoding apparatuses 601. The syntax code and the nesting code may be a fixed-length code of another size, or may be a variable-length code.

The orders of the compression code strings of FIGS. 19 and 20 are merely one example, and another order may be used in accordance with content of the application processing. In the compression code string of FIG. 19, for example, instead of arranging, after the syntax code of a leaf node, the word code of a word corresponding to the leaf node, the word code may be arranged before the syntax code. Alternatively, in the compression code string of FIG. 20, the nesting codes and the syntax codes may be collectively arranged in advance, and subsequently, the word codes may be arranged collectively.

Figure 31:
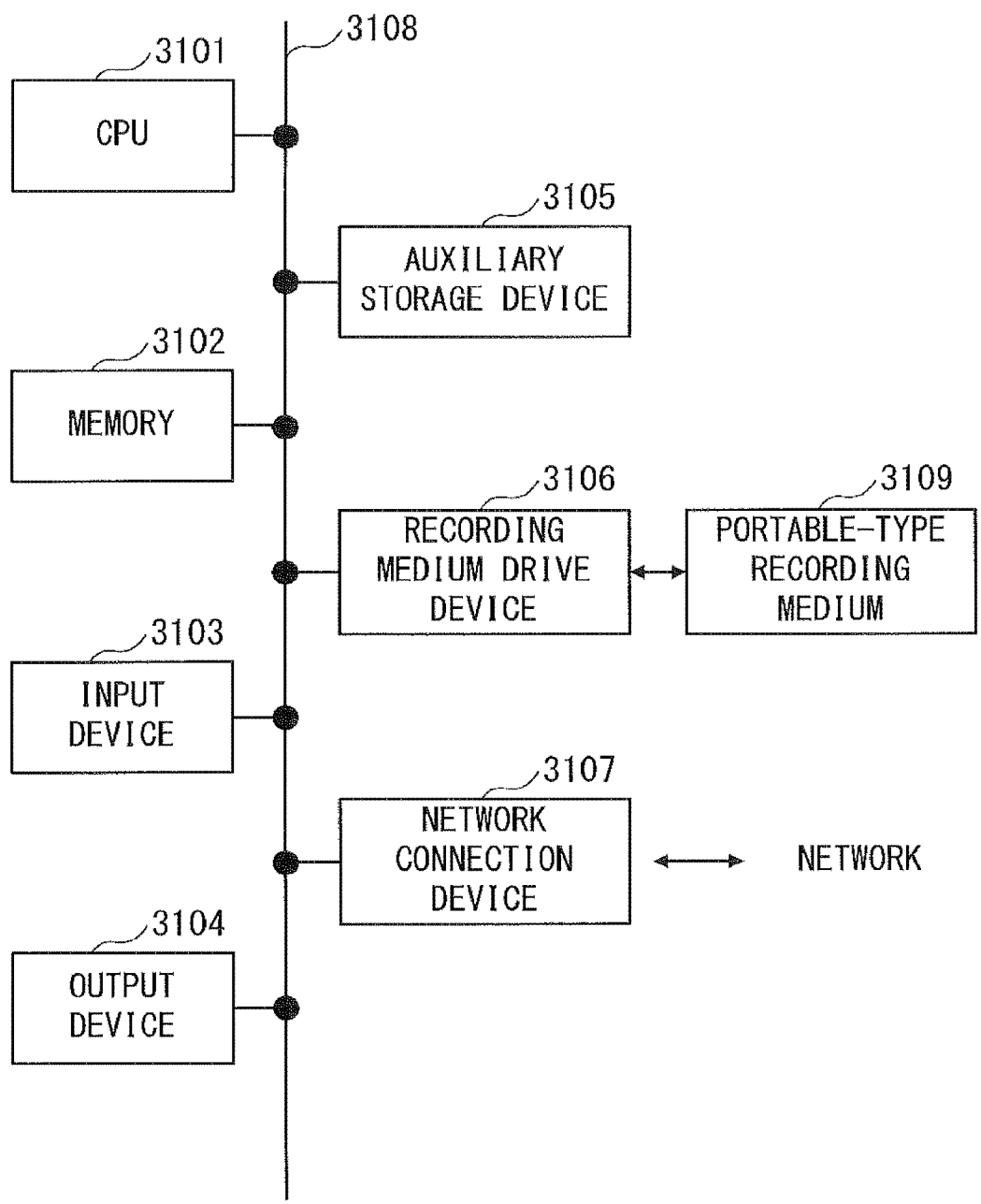
FIG. 31 is a block diagram of an information processing apparatus.

The encoding apparatuses 601 of FIGS. 6, 8, and 23 and the information processing apparatus that performs the application processing can be implemented, for example, using an information processing apparatus (computer) as illustrated in FIG. 31.

The information processing apparatus of FIG. 31 includes a Central Processing Unit (CPU) 3101, a memory 3102, an input device 3103, an output device 3104, an auxiliary storage device 3105, a recording medium drive device 3106, and a network connection device 3107. These components are connected to each other via a bus 3108.

Examples of the memory 3102 include semiconductor memories such as a Read Only Memory (ROM), a Random Access Memory (RAM), a flash memory, and the like. The memory 3102 stores programs and data for the encoding processing or the application processing. The memory 3102 can be used as the storage units 611 of FIGS. 6, 8, and 23.

The CPU 3101 executes programs, for example, using the memory 3102, and thereby operates as the syntax analysis unit 612, the encoding unit 613, the arrangement unit 614, and the lexical analysis unit 801 of FIGS. 6, 8, and 23 for the encoding processing. The CPU 3101 operates as the conversion unit 2301, the tabulation unit 2302, the generation unit 2303, and the conversion unit 2304 of FIG. 23 as well.

Examples of the input device 3103 include a keyboard, a pointing device, and the like, and the input device 3103 is used for an input of an instruction or information from the user or operator. Examples of the output device 3104 include a display device, a printer, a speaker, and the like, and the output device 3104 is used for an output of an inquiry or a processing result to the user or operator. The processing result may be the result of the application processing.

Examples of the auxiliary storage device 3105 include a magnetic disk device, an optical disk device, a magneto optical disk drive, a tape drive, and the like. The auxiliary storage device 3105 may be a hard disk drive or a flash memory. The information processing apparatus can store programs and data in the auxiliary storage device 3105, and can use the programs and data by loading them on the memory 3102. The auxiliary storage device 3105 can be used as the storage units 611 of FIGS. 6, 8, and 23.

The recording medium drive device 3106 drives a portable-type recording medium 3109 and accesses its recorded content. The portable-type recording medium 3109 may be a memory device, a flexible disk, an optical disk, a magneto optical disk, or the like. The portable-type recording medium 3109 may be a Compact Disk Read Only Memory (CD-ROM), a Digital Versatile Disk (DVD), a Universal Serial Bus (USB) memory, or the like. The user or operator can store programs and data in this portable-type recording medium 3109, and can use the programs and data by loading them on the memory 3102.

As described above, a computer readable recording medium that stores programs and data is a physical (non-transitory) recording medium as in the memory 3102, the auxiliary memory device 3105, and the portable-type recording medium 3109.

The network connection device 3107 is a communication interface that is connected to a communication network such as a Local Area Network (LAN), the Internet, or the like, and performs a data conversion along with communication. The information processing apparatus can receive programs and data from external apparatuses through the network connection device 3107, and can use the programs and data by loading them on the memory 3102. The network connection device 3107 can transmit the compression code string and the tabulation information 2314 to the information processing apparatus that performs the application processing.

Further, the information processing apparatus need not include all the components of FIG. 31, and a portion of the components can be omitted in accordance with usages or conditions of the information processing apparatus. For example, when an input of an instruction or information from the user or operator is not performed, the input device 3103 may be omitted. Further, when an output of an inquiry or a processing result to the user or operator is not performed, the output device 3104 may be omitted. When the information processing apparatus does not access the portable-type recording medium 3109 or the communication network, the recording medium drive device 3106 or the network connection device 3107 may be omitted.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
    generating a plurality of pieces of syntax information respectively corresponding to a plurality of words in a compression target document by analyzing relationships between the plurality of words;
    assigning a plurality of compression codes to the plurality of words and to the plurality of pieces of syntax information; and
    outputting the plurality of compression codes with an arrangement of a specific order.

2. The non-transitory computer-readable recording medium according to claim 1, wherein
    the specific order is an order in which a compression code assigned to each of the plurality of words and a compression code assigned to syntax information corresponding to each of the plurality of words are arranged adjacent to each other.

3. The non-transitory computer-readable recording medium according to claim 1, wherein
    the specific order is an order in which compression codes assigned to the plurality of words are arranged adjacent to each other.

4. The non-transitory computer-readable recording medium according to claim 1, wherein
    the plurality of pieces of syntax information are information in which a tree structure of a syntax tree indicating relationships between the plurality of words are expressed using a plurality of subtrees.

5. The non-transitory computer-readable recording medium according to claim 4, the process further comprising assigning a compression code to nesting information indicating a connection relationship between a subtree of a parent and a subtree of a child of the plurality of subtrees, wherein
    the outputting the plurality of compression codes outputs the plurality of compression codes assigned to the plurality of words, the plurality of pieces of syntax information, and the nesting information.

6. An encoding apparatus comprising:
    a memory configured to store a compression target document; and
    a processor coupled to the memory and configured to:
    generate a plurality of pieces of syntax information respectively corresponding to a plurality of words in a compression target document by analyzing relationships between the plurality of words;
    assign a plurality of compression codes to the plurality of words and to the plurality of pieces of syntax information; and
    output the plurality of compression codes with an arrangement of a specific order.

7. The encoding apparatus according to claim 6, wherein
    the specific order is an order in which a compression code assigned to each of the plurality of words and a compression code assigned to syntax information corresponding to each of the plurality of words are arranged adjacent to each other.

8. The encoding apparatus according to claim 6, wherein the specific order is an order in which compression codes assigned to the plurality of words are arranged adjacent to each other.

9. The encoding apparatus according to claim 6, wherein the plurality of pieces of syntax information are information in which a tree structure of a syntax tree indicating a relationship between the plurality of words is expressed using a plurality of subtrees.

10. The encoding apparatus according to claim 9, wherein the processor further assigns a compression code to nesting information indicating a connection relationship between a subtree of a parent and a subtree of a child of the plurality of subtrees, and outputs the plurality of compression codes assigned to the plurality of words, the plurality of pieces of syntax information, and the nesting information.

11. An encoding method comprising:
generating a plurality of pieces of syntax information respectively corresponding to a plurality of words in a compression target document by analyzing relationships between the plurality of words by a processor;
assigning a plurality of compression codes to the plurality of words and to the plurality of pieces of syntax information by the processor; and
outputting the plurality of compression codes with an arrangement of a specific order by the processor.

12. The encoding method according to claim 11, wherein the specific order is an order in which a compression code assigned to each of the plurality of words and a compression code assigned to the syntax information corresponding to each of the plurality of words are arranged adjacent to each other.

13. The encoding method according to claim 11, wherein the specific order is an order in which compression codes assigned to the plurality of words are arranged adjacent to each other.

14. The encoding method according to claim 11, wherein the plurality of pieces of syntax information are information in which a tree structure of a syntax tree indicating a relationship between the plurality of words is expressed using a plurality of subtrees.

15. The encoding method according to claim 14, further comprising assigning a compression code to nesting information indicating a connection relationship between a subtree of a parent and a subtree of a child of the plurality of subtrees, wherein
the outputting the plurality of compression codes outputs the plurality of compression codes assigned to the plurality of words, the plurality of pieces of syntax information, and the nesting information.

16. A search method comprising:
converting a first search keyword into a first word code by a processor;
searching for the first word code by the processor from a compression code string in which a plurality of word codes assigned to a plurality of words in a compression target document and a plurality of syntax codes assigned to a plurality of pieces of syntax information corresponding to the plurality of words are arranged with an arrangement of a specific order; and
referring to a first syntax code corresponding to the first word code within the compression code string and specifying a second word code from the compression code string.

17. The search method according to claim 16, wherein
the specific order is an order in which a word code assigned to each of the plurality of words and a syntax code assigned to syntax information corresponding to each of the plurality of words are arranged adjacent to each other, and
the specifying the second word code specifies as the first syntax code a syntax code adjacent to the first word code within the compression code string and specifies as the second word code a word code relating to the first word code based on the first syntax code.

18. The search method according to claim 16, wherein
the specific order is an order in which the plurality of word codes assigned to the plurality of words are arranged adjacent to each other, and
the specifying the second word code converts a second search keyword into the second word code and specifies from the compression code string the second word code corresponding to the second search keyword belonging to a syntax tree of the first search keyword and included in a vicinity of the first search keyword based on the first syntax code.

* * * * *